US012580542B2

(12) United States Patent
Liu et al.

(10) Patent No.: US 12,580,542 B2
(45) Date of Patent: Mar. 17, 2026

(54) FILTER, MANUFACTURING METHOD THEREFOR AND ELECTRONIC DEVICE

(71) Applicant: BOE Technology Group Co., Ltd.,
Beijing (CN)

(72) Inventors: Yingwei Liu, Beijing (CN); Zhonglan Zhao, Beijing (CN); Zhanfeng Cao, Beijing (CN); Ke Wang, Beijing (CN)

(73) Assignee: BOE Technology Group Co., Ltd.,
Beijing (CN)

( * ) Notice: Subject to any disclaimer, the term of this patent is extended or adjusted under 35 U.S.C. 154(b) by 162 days.

(21) Appl. No.: 18/576,747

(22) PCT Filed: Aug. 25, 2022

(86) PCT No.: PCT/CN2022/114811
§ 371 (c)(1),
(2) Date: Jan. 5, 2024

(87) PCT Pub. No.: WO2024/040517
PCT Pub. Date: Feb. 29, 2024

(65) Prior Publication Data
US 2025/0096763 A1 Mar. 20, 2025

(51) Int. Cl.
*H03H 1/00* (2006.01)
*H03H 3/00* (2006.01)
*H03H 7/01* (2006.01)

(52) U.S. Cl.
CPC .............. *H03H 1/00* (2013.01); *H03H 3/00* (2013.01); *H03H 7/0115* (2013.01); *H03H 2001/0078* (2013.01)

(58) Field of Classification Search
CPC .......... H03H 1/00; H03H 3/00; H03H 7/0115; H03H 2001/0085; H03H 2001/0078; H01F 5/00; H01F 17/00; H01L 23/66
See application file for complete search history.

(56) References Cited

U.S. PATENT DOCUMENTS 7,924,131 B2 * 4/2011 Walls .................. H01F 17/0013
                                                  336/200
11,018,652 B2 * 5/2021 Timme ................ H03H 9/0004
            (Continued)

FOREIGN PATENT DOCUMENTS

CN        101322201 A     12/2008
CN        108476014 A      8/2018
            (Continued)

OTHER PUBLICATIONS

International Search Report for PCT/CN2022/114811 Mailed Apr. 3, 2023.

*Primary Examiner* — Quan Tra
(74) *Attorney, Agent, or Firm* — Ling Wu; Stephen Yang; Ling and Yang Intellectual Property

(57) ABSTRACT

A filter, a manufacturing method therefor, and an electronic device are provided. The filter includes a first substrate and a second substrate disposed opposite to each other, and a connection substrate disposed therebetween, wherein at least one first substrate electrode is disposed on the first substrate, at least one second substrate electrode is disposed on the second substrate, the connection substrate comprises, at least, a connection base substrate and at least one conductive post penetrating the connection base substrate in a thickness direction, an end of the conductive post close to the first substrate is provided with a first bump structure, an end of the conductive post close to the second substrate is provided with a second bump structure, and the first bump structure is connected with the first substrate electrode, the second bump structure is connected with the second substrate electrode, both in a bonding manner.

19 Claims, 7 Drawing Sheets

(56)          References Cited

U.S. PATENT DOCUMENTS

| 12,290,000 | B2 * | 4/2025 | Hamasaki | ........... | H10N 30/883 |
|---|---|---|---|---|---|
| 2007/0268105 | A1 | 11/2007 | Walls | | |
| 2008/0252407 | A1 | 10/2008 | Anderson | | |
| 2010/0225434 | A1 | 9/2010 | Wang et al. | | |
| 2015/0371763 | A1 | 12/2015 | Gordin et al. | | |
| 2017/0187345 | A1 | 6/2017 | Yun et al. | | |
| 2021/0159877 | A1 * | 5/2021 | Fukuhara | ........... | H03H 9/02574 |
| 2022/0077554 | A1 * | 3/2022 | Tang | .................... | H01P 1/2002 |
| 2022/0321096 | A1 * | 10/2022 | Goto | .................. | H03H 9/02866 |
| 2023/0163746 | A1 * | 5/2023 | Caron | ................. | H03H 9/0561 |
| | | | | | 333/187 |
| 2024/0274571 | A1 * | 8/2024 | Suga | ...................... | H01L 23/50 |
| 2024/0379650 | A1 * | 11/2024 | An | .................... | H01L 23/53261 |

FOREIGN PATENT DOCUMENTS

| CN | 113035799 A | 6/2021 |
|---|---|---|
| CN | 114070222 A | 2/2022 |

* cited by examiner

FILTER, MANUFACTURING METHOD THEREFOR AND ELECTRONIC DEVICE

CROSS-REFERENCE TO RELATED APPLICATION

The present application is a U.S. National Phase Entry of International Application No. PCT/CN2022/114811 having an international filing date of Aug. 25, 2022, the entire content of which is hereby incorporated by reference.

TECHNICAL FIELD

The present disclosure relates to, but is not limited to, the field of semiconductor technologies, in particular to a filter, a manufacturing method therefor and an electronic device.

BACKGROUND

As an important component of a communication terminal, filters can solve a problem of mutual interference in a process of signal transmission and improve spectrum availability. With development of mobile communication technologies, mobile communication systems require filters with small area, high performance and good consistency. An Integrated Passive Device (IPD for short) is widely used in Radio Frequency (RF for short) front-end chips in wireless communication devices because of its superior independent passive component characteristics.

SUMMARY

The following is a summary of subject matters described herein in detail. The summary is not intended to limit the protection scope of the claims.

In one aspect, the present disclosure provides a filter including a first substrate and a second substrate disposed opposite to each other, and a connection substrate disposed between the first substrate and the second substrate, wherein at least one first substrate electrode is disposed on the first substrate, at least one second substrate electrode is disposed on the second substrate, the connection substrate includes, at least, a connection base substrate and at least one conductive post penetrating the connection base substrate in a thickness direction, an end of the conductive post close to the first substrate is provided with a first bump structure, an end of the conductive post close to the second substrate is provided with a second bump structure, the first bump structure is connected with the first substrate electrode in a bonding manner, and the second bump structure is connected with the second substrate electrode in a bonding manner.

In an exemplary implementation, the connection base substrate includes a first side surface close to the first substrate and a second side surface close to the second substrate, the first bump structure is disposed on the first side surface of the connection base substrate and connected with the end of the conductive post close to the first substrate, and the second bump structure is disposed on the second side surface of the connection base substrate and connected with the end of the conductive post close to the second substrate.

In an exemplary implementation, an orthographic projection of the first bump structure on the connection base substrate includes an orthographic projection of the conductive post on the connection base substrate, and an orthographic projection of the second bump structure on the connection base substrate includes an orthographic projection of the conductive post on the connection base substrate.

In an exemplary implementation, the first bump structure includes a first connection layer disposed on the first side surface of the connection base substrate, and a first bump layer disposed on a side of the first connection layer away from the connection base substrate, wherein the first connection layer is connected with the end of the conductive post close to the first substrate, the first bump layer is connected with the first substrate electrode in a bonding manner; the second bump structure includes a second connection layer disposed on the second side surface of the connection base substrate, and a second bump layer disposed on a side of the second connection layer away from the connection base substrate, wherein the second connection layer is connected with the end of the conductive post close to the second substrate, and the second bump layer is connected with the second substrate electrode in a bonding manner.

In an exemplary implementation, materials of the first connection layer and the second connection layer include any of the following: a composite layer of titanium and copper, a composite layer of molybdenum-titanium-nickel alloy and copper, a composite layer of molybdenum-titanium-nickel alloy, copper-nickel alloy and copper.

In an exemplary implementation, materials of the first bump layer and the second bump layer include any of the following: tin and an indium-tin alloy.

In an exemplary implementation, the conductive posts include, at least, a first conductive post and a second conductive post, the first substrate electrodes include, at least, a first connection electrode and a second connection electrode, the second substrate electrodes include, at least, a third connection electrode, the first connection electrode is connected with the first conductive post, the second connection electrode is connected with the second conductive post, the third connection electrode is connected with the first conductive post and the second conductive post, respectively, and the first conductive post, the second conductive post, the first connection electrode, the second connection electrode and the third connection electrode constitute a filter inductor of a three-dimensional spiral inductor structure.

In an exemplary embodiment, the first substrate is further provided with a filter capacitor connected with the filter inductor.

In an exemplary implementation, the first substrate includes, at least, a first base substrate, a first conductive layer disposed on a side of the first base substrate close to the connection substrate, a second conductive layer disposed on a side of the first conductive layer close to the connection substrate, a third conductive layer disposed on a side of the second conductive layer close to the connection substrate, and the first connection electrode and the second connection electrode are disposed in the third conductive layer.

In an exemplary implementation, the filter capacitor includes a first plate and a second plate, an orthographic projection of the first plate on the first base substrate is overlapped, at least partially, with an orthographic projection of the second plate on the first base substrate, the first plate is disposed in the second conductive layer, and the second plate is disposed in the third conductive layer.

In an exemplary implementation, the first conductive layer includes, at least, a first pad electrode, a second pad electrode and a fourth connection electrode, wherein the first connection electrode is connected with the first pad electrode through a via, the second connection electrode and the first plate are connected with the fourth connection electrode through a via, and a second plate is connected with the second pad electrode through a via.

In an exemplary implementation, the first substrate further includes a pad conductive layer and a pad protective layer, the pad protective layer is disposed on a side of the first base substrate away from the connection substrate, the pad conductive layer is disposed on a side of the pad protective layer away from the connection substrate, the pad conductive layer includes, at least, a first pad and a second pad, the first pad electrode is connected with the first pad through a via, and the second pad electrode is connected with the second pad through a via.

In an exemplary implementation, a surface of the side of the pad conductive layer away from the connection substrate is flush with a surface of the side of the first base substrate away from the connection substrate.

In an exemplary implementation, a surface of the side of the pad protective layer away from the connection substrate is flush with a surface of the side of the first base substrate away from the connection substrate.

In an exemplary implementation, the conductive posts include n conductive posts, the first substrate electrodes include one first connection electrode and n/2 second connection electrodes, the second substrate electrodes include n/2 third connection electrodes, the first connection electrode is connected with a first conductive post of the n conductive posts, an (n/2)-th second connection electrode is connected with an n-th conductive post of the n conductive posts, the other second connection electrodes are connected to an (i+1)-th conductive post and an (i+2)-th conductive post of the n conductive posts, respectively, a plurality of third connection electrodes are connected to an i-th conductive post and the (i+1)-th conductive post of the n conductive posts, respectively, and the n conductive posts, the first connection electrode, the n/2 second connection electrodes and the n/2 third connection electrodes constitute a first filter inductor of a three-dimensional spiral inductor structure, wherein n is an even number greater than or equal to 2, and i is an odd number greater than or equal to 1, and less than n−2.

In an exemplary implementation, the first substrate is further provided with a filter capacitor, a first pad and a second pad, wherein the first connection electrode is connected with the first pad, the (n/2)-th second connection electrode is connected with a first plate of the filter capacitor, and a second plate of the filter capacitor is connected with the second pad.

In an exemplary implementation, the second substrate includes, at least, a second base substrate, and a fourth conductive layer disposed on a side of the second base substrate close to the connection substrate, and the third connection electrode is disposed in the fourth conductive layer.

In another aspect, the present disclosure further provides an electronic device including the foregoing filter.

In a further aspect, the present disclosure further provides a method for manufacturing a filter, including:

manufacturing a first substrate, a second substrate and a connection substrate, respectively, wherein at least one first substrate electrode is provided on the first substrate, at least one second substrate electrode is provided on the second substrate, the connection substrate includes, at least, a connection base substrate and at least one conductive post penetrating through the connection base substrate, an end of the conductive post close to the first substrate is connected with a first bump structure, and an end of the conductive post close to the second substrate is connected with a second bump structure; and disposing the first substrate and the second substrate opposite to each other, disposing the connection substrate between the first substrate and the second substrate, connecting the first bump structure with the first substrate electrode in a bonding manner, and connecting the second bump structure with the second substrate electrode in a bonding manner.

In an exemplary implementation, manufacturing the connection substrate includes:

providing a connection base substrate on which a plurality of through holes are formed, wherein a material of the connection base substrate includes glass;

forming a plurality of conductive posts in the plurality of through holes; and forming a plurality of first bump structures on a first side surface of the connection base substrate and forming a plurality of second bump structures on a second side surface of the connection base substrate; wherein the first bump structure includes a first connection layer disposed on a first side surface of the connection base substrate, a first bump layer disposed on a side of the first connection layer away from the connection base substrate, a plurality of first connection layers are connected with ends of the plurality of conductive posts located on the first side surface, correspondingly; the second bump structure includes a second connection layer disposed on a second side surface of the connection base substrate and a second bump layer disposed on a side of the second connection layer away from the connection base substrate, and a plurality of second connection layers are connected with ends of the plurality of conductive posts located on the second side surface, correspondingly.

After the drawings and the detailed descriptions are read and understood, the other aspects may be comprehended.

BRIEF DESCRIPTION OF DRAWINGS

The accompany drawings are used to provide further understanding of the technical solution of the present disclosure, and form a part of the description. The accompany drawings and embodiments of the present disclosure are adopted to explain the technical solution of the present disclosure, but do not form limits to the technical solution of the present disclosure.

Figure 1:
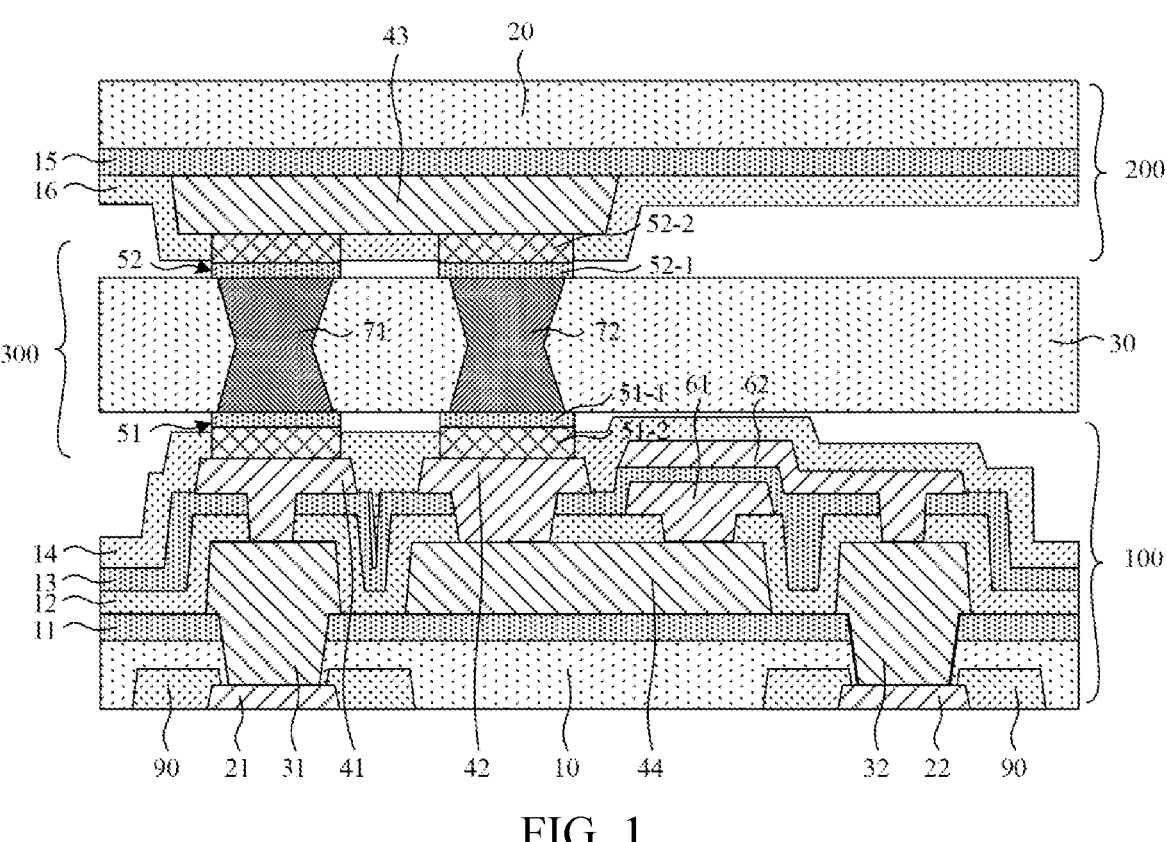
FIG. 1 is a schematic diagram of a structure of a filter according to an exemplary embodiment of the present disclosure.

Scales of the drawings in the present disclosure may be used as a reference in actual processes, but are not limited thereto. For example, a width-length ratio of a channel, a thickness and spacing of each film layer, and a width and spacing of each signal line may be adjusted according to actual needs. The drawings described in the present disclosure are only schematic diagrams of structures, and one implementation of the present disclosure is not limited to shapes or numerical values or the like shown in the drawings.

Ordinal numerals "first", "second", "third", etc., in the specification are set not to form limits in quantities but only to avoid the confusion of composition elements.

In the specification, for convenience, expressions "central", "above", "below", "front", "back", "vertical", "horizontal", "top", "bottom", "inside", "outside", etc., indicating directional or positional relationships are used to illustrate positional relationships between the composition elements, not to indicate or imply that involved devices or elements are required to have specific orientations and be structured and operated with the specific orientations but only to easily and simply describe the present specification, and thus should not be understood as limits to the present disclosure. The positional relationships between the composition elements may be changed as appropriate according to the direction with which each composition element is described. Therefore, appropriate replacements based on situations are allowed, not limited to the expressions in the specification.

In the specification, unless otherwise specified and defined, terms "mounting", "mutual connection", and "connection" should be generally understood. For example, the term may be fixed connection, or detachable connection, or integral connection. The term may be mechanical connection or electric connection. The term may be direct connection, or indirect connection through an intermediate, or communication inside two elements. Those of ordinary skill

| Description of reference numbers: | | |
|---|---|---|
| 10-first base substrate; | 10A-first carrier plate; | 10B-first de-bonding layer; |
| 11-first insulation layer; | 12-second insulation layer; | 13-third insulation layer; |
| 14-fourth insulation layer; | 15-fifth insulation layer; | 16-sixth insulation layer; |
| 20-second base substrate; | 20A-second carrier plate; | 20B-second de-bonding layer; |
| 21-first pad; | 22-second pad; | 30-connection base substrate; |
| 31-first pad electrode; | 32-second pad electrode; | 41-first connection electrode; |
| 42-second connection electrode; | 43-third connection electrode; | 44-fourth connection electrode; |
| 51-first bump structure; | 52-second bump structure; | 61-first plate; |
| 62-second plate; | 71-first conductive post; | 72-second conductive post; |
| 80-through hole; | 90-pad protective layer; | 100-first substrate; |
| 200-second substrate; | 300-connection substrate. | |

DETAILED DESCRIPTION

To make the objectives, technical solutions, and advantages of the present disclosure clearer, the embodiments of the present disclosure will be described in detail below in combination with the accompany drawings. It is to be noted that the implementations may be implemented in various forms. Those of ordinary skill in the art can easily understand such a fact that modes and contents may be transformed into various forms without departing from the purpose and scope of the present disclosure. Therefore, the present disclosure should not be explained as being limited to the contents recorded in the following implementations only. The embodiments and features in the embodiments of the present disclosure may be randomly combined with each other in case of no conflicts.

in the art can understand specific meanings of the above terms in the present disclosure according to specific situations.

In the specification, "electric connection" includes connection of the composition elements through an element with a certain electric action. "An element with a certain electric action" is not particularly limited as long as electric signals between the connected composition elements may be sent and received. Examples of "an element with a certain electric action" not only include an electrode and a line, but also include a switch element such as a transistor, a resistor, an inductor, a capacitor, another element with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, rectangle, trapezoid, pentagon, hexagon, etc. in this specification are not strictly defined, and they may be approximate triangle, rectangle, trapezoid, pentagon, hexagon, etc. There may be some small deformations caused by tolerance, and there may be chamfer, arc edge, deformation, etc.

In the present disclosure, "about" refers to that a boundary is not defined so strictly and numerical values within process and measurement error ranges are allowed.

In order to meet the increasing requirements on broadband, low cost and high integration, Through Glass Via (TGV for short) technologies have gradually become a feasible technology for passive filter (LC filter) design. Compared with silicon (Si)-based IPD, a TGV-based IPD can avoid a problem of high microwave loss caused by poor insulation of silicon-based devices, and can achieve better electrical performance. Compared with gallium arsenide (GaAs)-based IPD, a TGV-based IPD has advantages of low price and being suitable for high frequency applications.

The through glass via technology refers to making a through hole on glass substrate, filling a metal material in the through hole, and electrically connecting functional structures located on an upper surface of the glass substrate with functional structures located on a lower surface of the glass substrate through the metal materials in the through hole. A study suggests that when fabricating corresponding functional structures on the upper and lower surfaces of the glass substrate, high-temperature annealing, high-temperature film deposition and other processes are performed. Because of a difference between the thermal expansion coefficient of the metal material filled in the through hole and the thermal expansion coefficient of the glass substrate, it is easy for the metal material to protrude from the through hole, resulting in disconnection between the metal material and the functional structure and reducing a product yield.

The present disclosure provides a passive filter including a first substrate and a second substrate disposed opposite to each other, and a connection substrate disposed between the first substrate and the second substrate, wherein at least one first substrate electrode is disposed on the first substrate, at least one second substrate electrode is disposed on the second substrate, the connection substrate includes, at least, a connection base substrate and at least one conductive post penetrating the connection base substrate in a thickness direction, an end of the conductive post close to the first substrate is provided with a first bump structure, an end of the conductive post close to the second substrate is provided with a second bump structure, the first bump structure is connected with the first substrate electrode in a bonding manner, and the second bump structure is connected with the second substrate electrode in a bonding manner.

In an exemplary implementation, the connection base substrate includes a first side surface close to the first substrate and a second side surface close to the second substrate, the first bump structure is disposed on the first side surface of the connection base substrate and connected with the end of the conductive post close to the first substrate, and the second bump structure is disposed on the second side surface of the connection base substrate and connected with the end of the conductive post close to the second substrate.

In an exemplary implementation, the first bump structure includes a first connection layer disposed on the first side surface of the connection base substrate, and a first bump layer disposed on a side of the first connection layer away from the connection base substrate, wherein the first connection layer is connected with the end of the conductive post close to the first substrate, the first bump layer is connected with the first substrate electrode in a bonding manner; the second bump structure includes a second connection layer disposed on the second side surface of the connection base substrate, and a second bump layer disposed on a side of the second connection layer away from the connection base substrate, wherein the second connection layer is connected with the end of the conductive post close to the second substrate, and the second bump layer is connected with the second substrate electrode in a bonding manner.

In an exemplary implementation, the conductive posts include, at least, a first conductive post and a second conductive post, the first substrate electrodes include, at least, a first connection electrode and a second connection electrode, the second substrate electrodes include, at least, a third connection electrode, the first connection electrode is connected with the first conductive post, the second connection electrode is connected with the second conductive post, the third connection electrode is connected with the first conductive post and the second conductive post, respectively, and the first conductive post, the second conductive post, the first connection electrode, the second connection electrode and the third connection electrode constitute a filter inductor of a three-dimensional spiral inductor structure.

In an exemplary embodiment, the first substrate is further provided with a filter capacitor connected with the filter inductor.

FIG. 1 is a schematic diagram of a structure of a filter according to an exemplary embodiment of the present disclosure. As shown in FIG. 1, a main structure of the filter in the exemplary embodiment of the present disclosure may include a first substrate 100 and a second substrate 200 disposed opposite to each other, and a connection substrate 300 disposed between the first substrate 100 and the second substrate 200. The first substrate 100 is connected with the connection substrate 300 in a bonding manner, and the second substrate 200 is connected with the connection substrate 300 in a bonding manner, constituting a passive filter including a filter inductor and a filter capacitor.

In an exemplary implementation, the connection substrate 300 may include, at least, a connection base substrate 30, a first conductive post 71 and a second conductive post 72 which penetrate the connection base substrate 30 in a thickness direction. The first substrate 100 may include, at least, a first base substrate 10, and a first connection electrode 41 and a second connection electrode 42 which are disposed on a side of the first base substrate 10 close to the second substrate 200. The second substrate 200 may include, at least, a second base substrate 20, and a third connection electrode 43 disposed on a side of the second substrate 20 close to the first substrate 100. Both of the first conductive post 71 and the second conductive post 72 are provided with a first bump structure 51 at an end close to the first substrate 100, respectively. Both of the first conductive post 71 and the second conductive post 72 are provided with a second bump structure 52 at an end close to the second substrate 200, respectively. The two first bump structures 51 of the connection substrate 300 are connected with the first connection electrode 41 and the second connection electrode 42 of the first substrate 100 in a bonding manner, respectively, and the two first bump structures 51 of the connection substrate 300 are connected with the third connection electrode 43 of the second substrate 200 in a bonding manner, respectively, to form an electrical connection structure of the first substrate 100, the connection substrate 300 and the second substrate 200.

In an exemplary implementation, the first connection electrode 41 and the second connection electrode 42 may serve as first substrate electrodes of the present disclosure, and the third connection electrode 43 may serve as a second substrate electrode of the present disclosure.

In an exemplary implementation, the connection base substrate 30 may include a first side surface close to the first substrate 100 and a second side surface close to the second substrate 200, the two first bump structures 51 may be disposed on the first side surface of the connection base substrate 30 and connected with ends of the first conductive posts 71 and 72 close to the first substrate 100, respectively, and the two second bump structures 52 may be disposed on the second side surface of the connection base substrate 30 and connected with ends of the first conductive posts 71 and 72 close to the second substrate 200, respectively.

In an exemplary implementation, an orthographic projection of the first bump structure 51 on the connection base substrate may include orthographic projections of the first conductive post 71 and the second conductive post 72 on the connection base substrate, and an orthographic projection of the second bump structure 52 on the connection base substrate may include orthographic projections of the first conductive post 71 and the second conductive post 72 on the connection base substrate.

In an exemplary implementation, the first bump structure 51 may include a first connection layer 51-1 and a first bump layer 51-2 which are stacked. The first connection layer 51-1 may be disposed on the first side surface of the connection base substrate 30 and connected with ends of the first conductive post 71 and the second conductive post 72 close to the first substrate 100, respectively. The first bump layer 51-2 may be disposed on a side of the first connection layer 51-1 away from the connection base substrate 30 and connected with the first connection electrode 41 and the second connection electrode 42 in a bonding manner, respectively.

In an exemplary implementation, the second bump structure 52 may include a second connection layer 52-1 and a second bump layer 52-2 which are stacked. The second connection layer 52-1 may be disposed on the second side surface of the connection base substrate 30 and connected with ends of the first conductive post 71 and the second conductive post 72 close to the second substrate 200, respectively. The second bump layer 52-2 may be disposed on a side of the second connection layer 52-1 close to the second substrate 200 and connected with the third connection electrode 43 in a bonding manner.

In an exemplary implementation, materials of the first connection layer 51-1 and the second connection layer 52-1 may include any of the following: a composite layer of titanium and copper, a composite layer of molybdenum-titanium-nickel alloy and copper, and a composite layer of molybdenum-titanium-nickel alloy, copper-nickel alloy and copper.

In an exemplary implementation, materials of the first bump layer 51-2 and the second bump layer 52-2 include any of the following: tin and an indium-tin alloy.

In an exemplary implementation, the first substrate 100 may include a filter inductor of a three-dimensional spiral inductor structure and a filter capacitor of a parallel plate capacitor structure, and the filter inductor is connected with the filter capacitor.

In an exemplary implementation, the first connection electrode 41 is connected with the first conductive post 71 through the first bump structure 51, the second connection electrode 42 is connected with the second conductive post 72 through the first bump structure 51, the third connection electrode 43 is connected with the first conductive post 71 and the second conductive post 72 through the second bump structures 52, respectively, and the first connection electrode 41, the first conductive post 71, the third connection electrode 43, the second conductive post 72 and the second connection electrode 42 which are connected sequentially constitute a filter inductor of a three-dimensional spiral inductor structure.

In an exemplary implementation, the filter capacitor may include a first plate 61 and a second plate 62, an orthographic projection of the first plate 61 on the first base substrate 10 is overlapped, at least partially, with an orthographic projection of the second plate 62 on the first base substrate.

In an exemplary implementation, the first substrate 100 may include, at least, a first base substrate 10, a first insulation layer 11 disposed on a side of the first base substrate 10 close to the connection substrate 300, a first conductive layer disposed on a side of the first insulation layer 11 close to the connection substrate 300, a second insulation layer 12 disposed on a side of the first conductive layer close to the connection substrate 300, a second conductive layer disposed on a side of the second insulation layer 12 close to the connection substrate 300, a third insulation layer 13 disposed on a side of the second conductive layer close to the connection substrate 300, a third conductive layer disposed on a side of the third insulation layer 13 close to the connection substrate 300, and a fourth insulation layer 14 disposed on a side of the third conductive layer close to the connection substrate 300.

In an exemplary implementation, the first conductive layer may include, at least, a first pad electrode 31, a second pad electrode 32, and a fourth connection electrode 44, the second conductive layer may include, at least, a first plate 61, and the third conductive layer may include, at least, a first connection electrode 41, a second connection electrode 42, and a second plate 62, the second connection electrode 42 may be connected with the fourth connection electrode 44 through a via, and the first plate 61 may be connected to the fourth connection electrode 44 through a via, thereby enabling interconnection of the filter inductor and the filter capacitor through the fourth connection electrode 44.

In an exemplary implementation, at least two first bonding vias are provided on the fourth insulation layer 14, wherein the at least two first bonding vias expose the first connection electrode 41 and the second connection electrode 42, respectively, and the at least two first bump structures 51 extend into corresponding first bonding vias to bond with the first connection electrode 41 and the second connection electrode 42, respectively.

In an exemplary implementation, the second substrate 200 may include, at least, the second base substrate 20, a fifth insulation layer 15 disposed on a side of the second base substrate 20 close to the connection substrate 300, a fourth conductive layer disposed on a side of the fifth insulation layer 15 close to the connection substrate 300, and a sixth insulation layer 16 disposed on a side of the fourth conductive layer close to the connection substrate 300.

In an exemplary implementation, the fourth conductive layer may include, at least, the third connection electrode. At least two second bonding vias are provided on the sixth insulation layer 16, wherein the at least two second bonding vias expose the third connection electrode 43, respectively, and the at least two second bump structures 52 extend into corresponding second bonding vias to bond with the third connection electrode 43, respectively.

In an exemplary implementation, the first substrate 100 may further include a pad conductive layer and a pad protective layer 90, wherein the pad protective layer 90 may be disposed on a side of the first base substrate 10 away from the connection substrate 300, and the pad conductive layer may be disposed on a side of the pad protective layer 90 away from the connection substrate 300.

In an exemplary implementation, a surface of the side of the pad protective layer 90 away from the connection substrate 300 and a surface of the side of the first base substrate 10 away from the connection substrate 300 may be substantially flush.

In an exemplary implementation, a surface of the side of the pad conductive layer away from the connection substrate 300 and a surface of the side of the first base substrate 10 away from the connection substrate 300 may be substantially flush.

In an exemplary implementation, the pad conductive layer may include at least one first pad 21 and at least one second pad 22, a first via and a second via are provided on the first base substrate 10 and the first insulation layer 11, the first pad electrode 31 may be connected with the first pad 21 through the first via, and the second pad electrode 32 may be connected with the second pad 22 through the second via.

In an exemplary implementation, the first connection electrode 41 may be connected with the first pad electrode 31 through a via, and the second plate 62 may be connected with the second pad electrode 32 through a via, thereby enabling connection of the first pad 21 with the filter inductor and connection of the second pad 22 with the filter capacitor.

In an exemplary implementation, quantities of the conductive posts and the connection electrodes included in the filter inductor of the three-dimensional spiral inductor structure may be set according to parameters, such as inductance (e.g. coil turns).

In an exemplary implementation, n through holes penetrating the connection base substrate 30 in the thickness direction may be provided on the connection substrate 300, n conductive posts are provided in the n through holes, respectively, and the n conductive posts may be regularly arranged in a preset direction. The first substrate 100 may be provided with a first connection electrode 41 and n/2 second connection electrodes 42, the second substrate 200 may be provided with n/2 third connection electrodes 43, the first connection electrode 41 may be connected to a first conductive post of the n conductive posts, an (n/2)-th second connection electrode 42 may be connected to an n-th conductive post of the n conductive posts, the other plurality of second connection electrodes 42 may be connected to an (i+1)-th conductive post and an (i+2)-th conductive post of the n conductive posts, respectively, and a plurality of third connection electrodes 43 may be connected to an i-th conductive post and the (i+1)-th conductive post of the n conductive posts, respectively. The n conductive posts, the first connection electrode 41, the n/2 second connection electrodes 42 and the n/2 third connection electrodes 43 constitute a first filter inductor of a three-dimensional spiral inductor structure, wherein n is an even number greater than or equal to 2, and i is an odd number greater than or equal to 1, and less than n−2.

In an exemplary implementation, the first connection electrode 41 may be connected with a first pad of a resonator, the (n/2)-th second connection electrode 42 may be connected with a first plate of the filter capacitor, and a second plate of the filter capacitor may be connected with a second pad of the resonator.

Exemplary description is made below through a manufacturing process of a filter. A "patterning process" mentioned in the present disclosure includes photoresist coating, mask exposure, development, etching, photoresist stripping, etc., for a metal material, an inorganic material, or a transparent conductive material, and includes organic material coating, mask exposure, development, etc., for an organic material. Deposition may be any one or more of sputtering, evaporation and chemical vapor deposition, the coating may be any one or more of spray coating, spin coating and inkjet printing, and the etching may be any one or more of dry etching and wet etching, the present disclosure is not limited thereto. A "film" refers to a layer of film made of a certain material on a substrate using deposition, coating, or other processes. If the "film" does not need to be processed through a patterning process in an entire manufacturing process, the "film" may also be referred to as a "layer". If the "film" needs to be processed through the patterning process in the entire manufacturing process, the "film" is referred to as a "film" before the patterning process is performed and is referred to as a "layer" after the patterning process is performed. At least one "pattern" is contained in the "layer" which has been processed through the patterning process. "A and B are disposed in a same layer" in the present disclosure means that A and B are formed simultaneously through a same patterning process, and a "thickness" of the film layer is a size of the film layer in a direction perpendicular to the filter. In an exemplary embodiment of the present disclosure, "an orthographic projection of B being within a range of an orthographic projection of A" or "an orthographic projection of A containing an orthographic projection of B" means that a boundary of the orthographic projection of B falls within a range of a boundary of the orthographic projection of A, or the boundary of the orthographic projection of A is overlapped with the boundary of the orthographic projection of B.

The manufacturing process of the filter in the exemplary embodiments of the present disclosure may include, at least, four parts, which are manufacturing of a first substrate, manufacturing of a second substrate, manufacturing of a connection substrate, and a bonding treatment, respectively. The manufacturing of the connection substrate, the manufacturing of the first substrate and the manufacturing of the second substrate can be performed without a sequence requirement, that is, can be performed simultaneously. The bonding treatment needs to be performed after the manufacturing of the connection substrate, the first substrate and the second substrate is completed. The four parts of the manufacturing process are described below, respectively.

A First Part, the Manufacturing of the First Substrate

In an exemplary implementation, the manufacturing process of the first substrate may include following operations.

Figure 2:
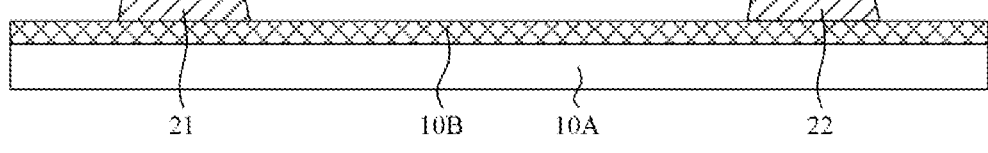
FIG. 2 is a schematic diagram of a filter after forming a pattern of a pad conductive layer according to an embodiment of the present disclosure.

(11) A pattern of a pad conductive layer is formed. In an exemplary implementation, forming the pattern of the pad conductive layer may include providing a first carrier plate 10A, forming a first De-bonding Layer (DBL for short) 10B on the first carrier plate 10A at first, then depositing a pad conductive film on the first de-bonding layer 10B, patterning the pad conductive film using a patterning process, and forming a pattern of the pad conductive layer on the first de-bonding layer 10B, as shown in FIG. 2.

In an exemplary implementation, the pad conductive layer may include, at least, a first pad 21 configured as an input terminal of the filter and a second pad 22 configured as an output terminal of the filter, or a first pad 21 configured as an output terminal of the filter and a second pad 22 configured as an input terminal of the filter.

In an exemplary implementation, a material of the first carrier plate may be glass, a material of the first de-bonding layer may be an organic polymer material, and may be formed by coating a viscous liquid and then curing to form a film. The first de-bonding layer is configured to separate the first substrate from the first carrier plate in a subsequent Laser Lift-Off (LLO for short) process.

In an exemplary implementation, forming the pattern of the pad conductive layer may also employ a Lift-Off process. For example, a photoresist is coated on the first carrier plate at first, and a photoresist pattern is formed after exposure and development, and then a pad conductive film is deposited. Subsequently, the photoresist pattern and the pad conductive film on the photoresist pattern are lifted off, and a pattern of the pad conductive layer including the first pad 21 and the second pad 22 is formed on the first carrier plate.

Figure 3:
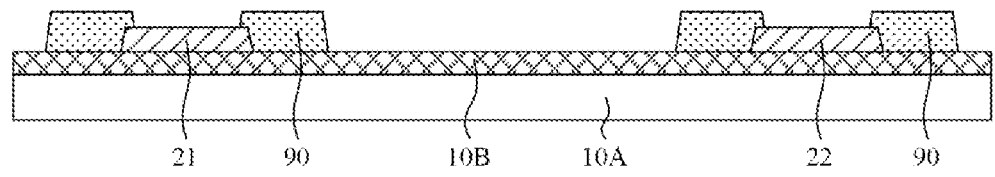
FIG. 3 is a schematic diagram of a filter after forming a pattern of a pad protective layer according to an embodiment of the present disclosure.

(12) A pattern of a pad protective layer is formed. In an exemplary implementation, forming the pattern of the pad protective layer may include depositing a pad protective film on the first carrier plate 10A on which the foregoing pattern is formed, patterning the pad protective film using a patterning process, and forming a pad protective layer 90 pattern covering the pad conductive layer, as shown in FIG. 3.

In an exemplary implementation, the pad protective layer 90 may be disposed only in a region where the first pad 21 and the second pad 22 are located, and a pad protective layer 90 covering the first pad 21 and the second pad 22 is provided with a first transition hole and a second transition hole, a pad protective film in the first transition hole is removed to expose a surface of the first pad 21, and a pad protective film in the second transition hole is removed to expose a surface of the second pad 22.

Figure 4:
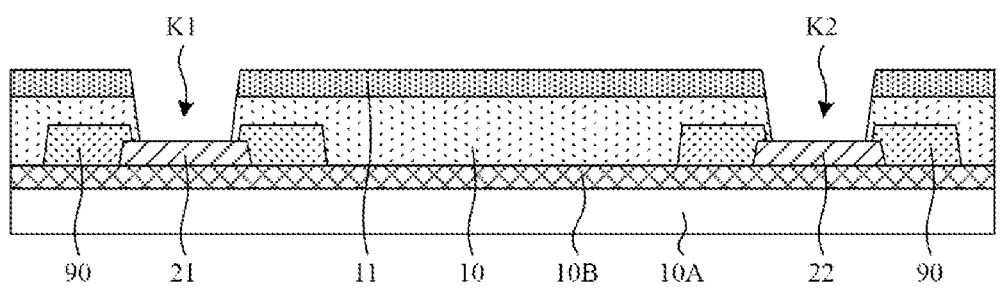
FIG. 4 is a schematic diagram of a filter after forming a pattern of a first base substrate according to an embodiment of the present disclosure.

(13) A pattern of a first base substrate is formed. In an exemplary implementation, forming the pattern of the first base substrate may include coating, at first, a first base substrate film on the first carrier plate 10A on which the foregoing patterns are formed, depositing a first insulation film after curing the first base substrate film, patterning the first insulation film and the first base substrate film using a patterning process, and forming a first base substrate 10 covering the pad conductive layer and the pad protective layer, and a first insulation layer 11 disposed on a side of the first base substrate 10 away from the first carrier plate 10A, as shown in FIG. 4.

In an exemplary implementation, the first base substrate 10 covers not only the pad conductive layer and the pad protective layer 90, but also the first de-bonding layer 10B other than the pad protective layer 90. In the region where the first pad 21 is located, the first base substrate 10 and the first insulation layer 11 are provided with a first via K1, an orthographic projection of the first via K1 on the first base substrate may be within an orthographic projection of the first pad 21 on the first base substrate, a first insulation film and a first substrate film in the first via K1 are removed to expose the surface of the first pad 21, and the first via K1 is configured to connect a first pad electrode formed subsequently with the first pad 21 through the via. In the region where the second pad 22 is located, the first base substrate 10 and the first insulation layer 11 are provided with a second via K2, an orthographic projection of the second via K2 on the first base substrate may be within an orthographic projection of the second pad 22 on the first base substrate, a first insulation film and a first substrate film in the second via K2 are removed to expose the surface of the second pad 22, and the second via K2 is configured to connect a second pad electrode formed subsequently with the second pad 22 through the via.

In an exemplary implementation, the orthographic projection of the first via K1 on the first base substrate 10 may be within a range of an orthographic projection of the first transition hole on the first base substrate 10, and the orthographic projection of the second via K2 on the first base substrate 10 may be within a range of an orthographic projection of the second transition hole on the first base substrate 10.

In an exemplary implementation, a material of the first base substrate may be polyimide (PI), polyethylene terephthalate (PET) or other materials.

Figure 5:
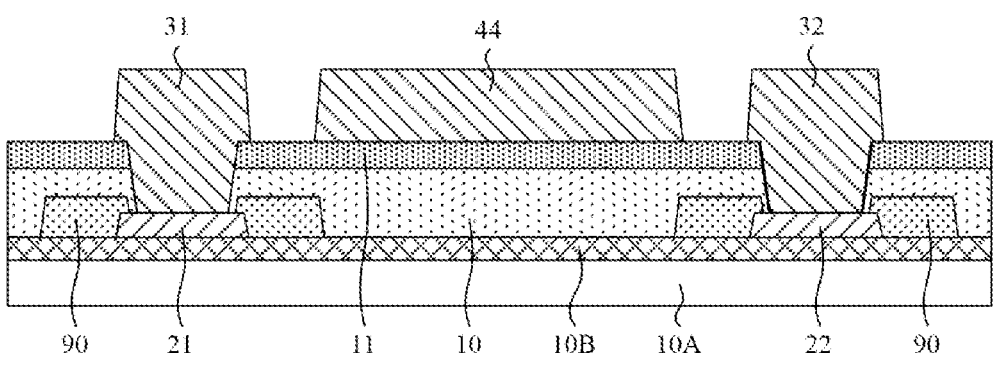
FIG. 5 is a schematic diagram of a filter after forming a pattern of a first conductive layer according to an embodiment of the present disclosure.

(14) A pattern of a first conductive layer is formed. In an exemplary implementation, forming the pattern of the first conductive layer may include forming the pattern of the first conductive layer on a side of the first insulation layer 11 away from the first carrier plate 10A by a seed layer deposition method and an additive method on the first carrier plate 10A on which the foregoing patterns are formed, as shown in FIG. 5.

In an exemplary implementation, the pattern of the first conductive layer may include, at least, a first pad electrodes 31, a second pad electrode 32 and a fourth connection electrode 44 disposed at intervals.

In an exemplary implementation, the first pad electrode 31 may be connected with the first pad 21 through the first via K1, and the second pad electrode 32 may be connected with the second pad 22 through the second via K2, the first pad electrode 31 is configured to connect with the first connection electrode formed subsequently, and the second pad electrode 32 is configured to connect with the second plate formed subsequently.

In an exemplary implementation, the fourth connection electrode 44 may be disposed between the first pad electrode 31 and the second pad electrode 32, and the fourth connection electrode 44 is configured to connect with the first connection electrode and the first plate formed subsequently, so as to achieve connection of the filter inductor with the filter capacitor.

In an exemplary implementation, the seed layer deposition method may be an Electrochemical Deposition (ECD for short) method or the like, and the additive method refers to a method in which a conductive film is deposited selectively to form a conductive pattern.

In an exemplary implementation, forming the pattern of the first conductive layer may also employ a patterning process or may employ a lift-off process.

Figure 6:
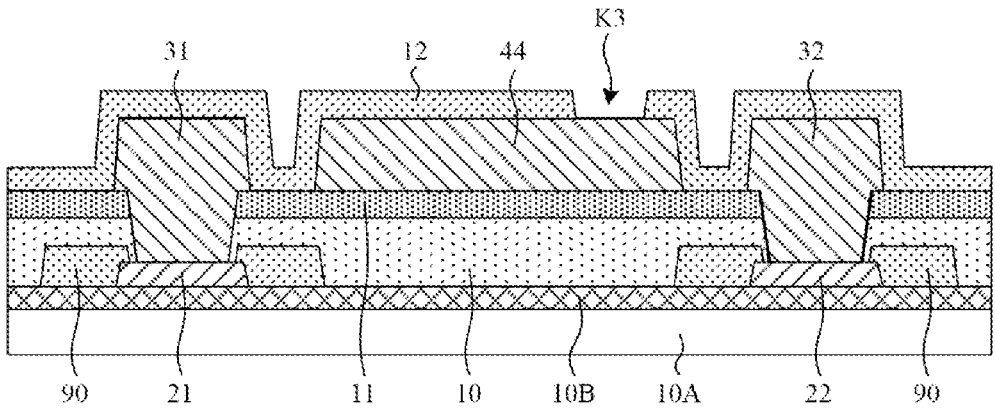
FIG. 6 is a schematic view of a filter after a pattern of a second insulation layer is formed in accordance with an embodiment of the present disclosure.

(15) A pattern of a second insulation layer is formed. In an exemplary implementation, forming the pattern of the second insulation layer may include depositing a second insulation film on the first carrier plate 10A on which the foregoing patterns are formed, and patterning the second insulation film using a patterning process to form a pattern of a second insulation layer 12 covering the pattern of the first conductive layer, as shown in FIG. 6.

In an exemplary implementation, a third via K3 is formed on the second insulation layer 12, an orthographic projection of the third via K3 on the first base substrate may be located within a range of an orthographic projection of the fourth connection electrode 44 on the first base substrate, a second insulation film in the third via K3 is removed to expose a surface of the fourth connection electrode 44, and the third via K3 is configured such that the first plate formed subsequently is connected with the fourth connection electrode 44 through the via.

Figure 7:
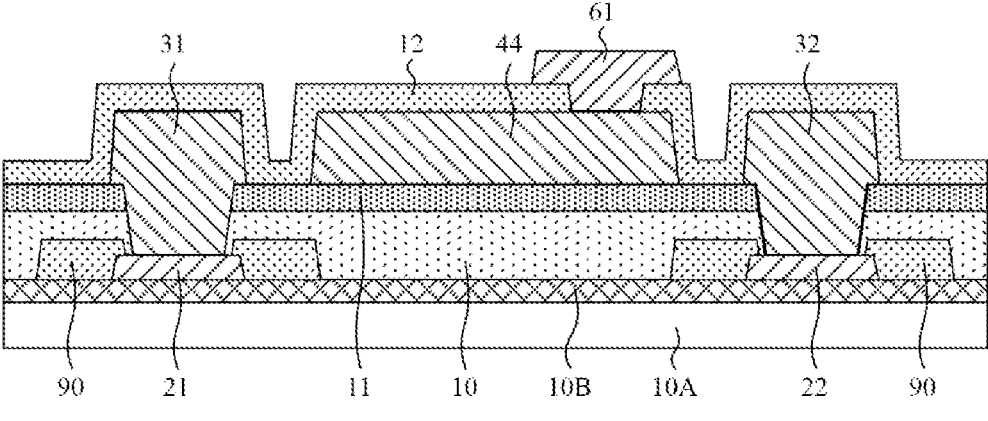
FIG. 7 is a schematic diagram of a filter after forming a pattern of a second conductive layer according to an embodiment of the present disclosure.

(16) A pattern of a second conductive layer is formed. In an exemplary implementation, forming the pattern of the second conductive layer may include depositing a second conductive film on the first carrier plate 10A on which the foregoing patterns are formed, and patterning the second conductive film by a patterning process to form a pattern of the second conductive layer on the second insulation layer 12, as shown in FIG. 7.

In an exemplary implementation, the pattern of the second conductive layer may include, at least, a first plate 61 connected with the fourth connection electrode 44 through the third via K3, and the first plate 61 may serve as one plate (lower plate) of the filter capacitor.

In an exemplary implementation, forming the pattern of the second conductive layer may also employ a lift-off process.

Figure 8:
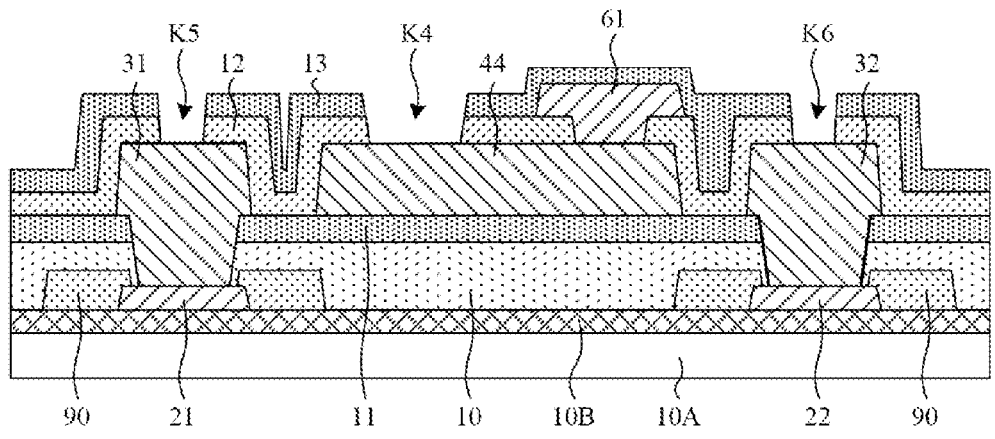
FIG. 8 is a schematic diagram of a filter after forming a pattern of a third insulation layer according to an embodiment of the present disclosure.

(17) A pattern of a third insulation layer is formed. In an exemplary implementation, forming the pattern of the third insulation layer may include depositing a third insulation film on the first carrier plate 10A on which the foregoing patterns are formed, and patterning the third insulation film using a patterning process to form a pattern of the third insulation layer 13 covering the pattern of the second conductive layer, as shown in FIG. 8.

In an exemplary implementation, a fourth via K4, a fifth via K5 and a sixth via K6 are formed on the third insulation layer 13.

In an exemplary implementation, an orthographic projection of the fourth via K4 on the first base substrate may be located within a range of an orthographic projection of the fourth connection electrode 44 on the first base substrate, a third insulation film and a second insulation film in the fourth via K4 are removed to expose a surface of the fourth connection electrode 44, and the fourth via K4 is configured such that a second connection electrode formed subsequently is connected with the fourth connection electrode 44 through the via.

In an exemplary implementation, an orthographic projection of the fifth via K5 on the first base substrate may be located within a range of an orthographic projection of the first pad electrode 31 on the first base substrate, a third insulation film and a second insulation film in the fifth via K5 are removed to expose a surface of the first pad electrode 31, and the fifth via K5 is configured such that the first connection electrode formed subsequently is connected with the first pad electrode 31 through the via.

In an exemplary implementation, an orthographic projection of the sixth via K6 on the first base substrate may be located within a range of an orthographic projection of the second pad electrode 32 on the first base substrate, a third insulation film and a second insulation film in the sixth via K6 are removed to expose a surface of the second pad electrode 32, and the sixth via K6 is configured such that the second plate formed subsequently is connected with the second pad electrode 32 through the via.

Figure 9:
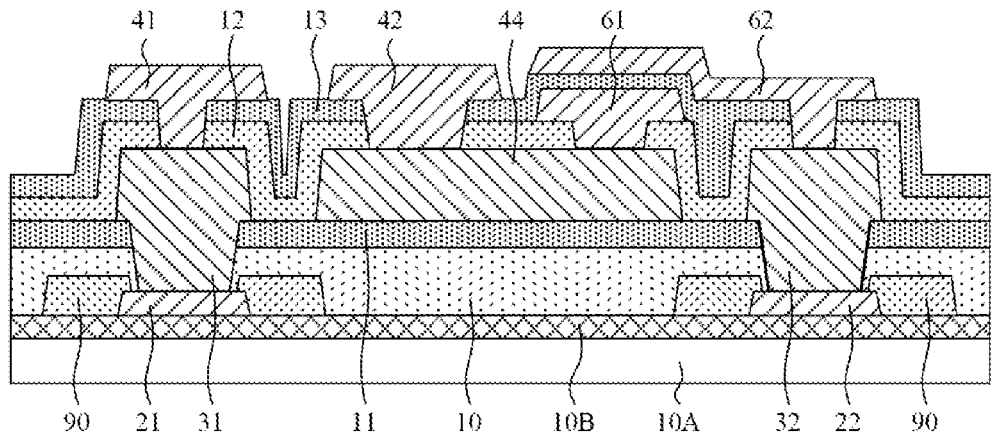
FIG. 9 is a schematic diagram of a filter after forming a pattern of a third conductive layer according to an embodiment of the present disclosure.

(18) A pattern of a third conductive layer is formed. In an exemplary implementation, forming the pattern of the third conductive layer may include depositing a third conductive film on the first carrier plate 10A on which the foregoing patterns are formed, and patterning the third conductive film by a patterning process to form a pattern of the third conductive layer on the third insulation layer 13, as shown in FIG. 9.

In an exemplary implementation, the pattern of the third conductive layer may include, at least, a first connection electrode 41, a second connection electrode 42 and a second plate 62.

In an exemplary implementation, an orthographic projection of the first connection electrode 41 on the first base substrate 10 is overlapped, at least partially, with an orthographic projection of the first pad electrode 31 on the first base substrate 10, the first connection electrode 41 is connected with the first pad electrode 31 through the fifth via K5, and the first connection electrode 41 is configured to bond to a first bump structure in the connection substrate.

In an exemplary implementation, an orthographic projection of the second connection electrode 42 on the first base substrate 10 is overlapped, at least partially, with an orthographic projection of the fourth connection electrode 44 on the first base substrate 10, the second connection electrode 42 is connected with the fourth connection electrode 44 through the fourth via K4, and the second connection electrode 42 is configured to bond to a first bump structure in the connection substrate.

In an exemplary implementation, an orthographic projection of the second plate 62 on the first base substrate 10 is overlapped, at least partially, with the orthographic projection of the first plate 61 on the first base substrate 10 and an orthographic projection of the second pad electrode 32 on the first base substrate 10, the second plate 62 is connected with the second pad electrode 32 through the sixth via K6, the second plate 62 may serve as another plate (upper plate) of the filter capacitor, and the first plate 61 and the second plate 62 constitute a filter capacitor of a planar film capacitor structure.

In an exemplary implementation, forming the pattern of the third conductive layer may also employ a lift-off process.

In an exemplary implementation, after the third conductive layer pattern is formed, surfaces of the first connection electrode 41 and the second connection electrodes 42 away from the first base substrate may be polished by chemical mechanical polishing so that the surfaces of the first connection electrode 41 and the second connection electrode 42 are flush, and surface roughness of the surfaces of the first connection electrode 41 and the second connection electrode 42 away from the first substrate may be less than or equal to 1 nm.

Figure 10:
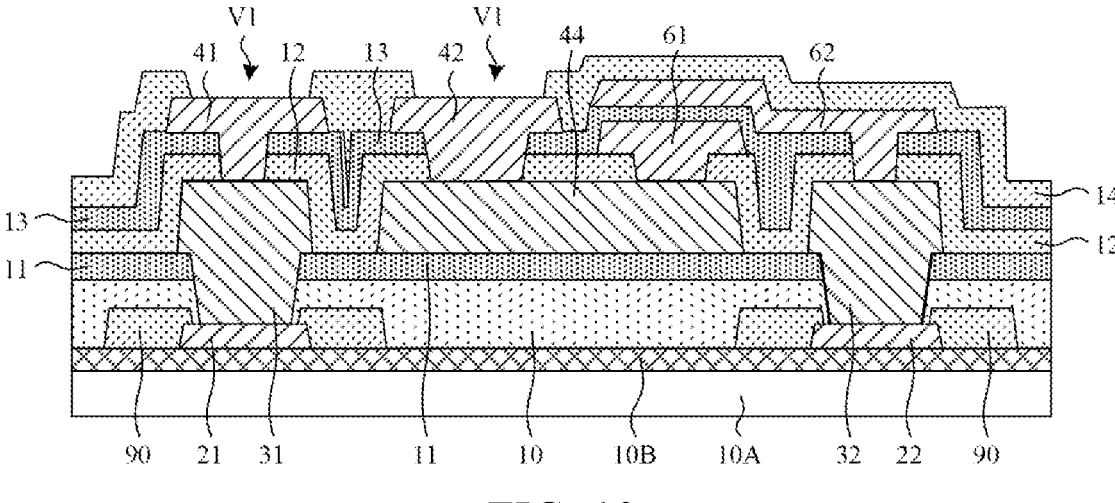
FIG. 10 is a schematic view of a filter after a pattern of a fourth insulation layer is formed in accordance with an embodiment of the present disclosure.

(19) A pattern of a fourth insulation layer is formed. In an exemplary implementation, forming the pattern of the fourth insulation layer may include depositing a fourth insulation film on the first carrier plate 10A on which the foregoing patterns are formed, and patterning the fourth insulation film using a patterning process to form a pattern of a fourth insulation layer 14 covering the pattern of the third conductive layer, as shown in FIG. 10.

In an exemplary implementation, two first bonding vias V1 are formed on the fourth insulation layer 14.

In an exemplary implementation, an orthographic projection of a first bonding via V1 on the first base substrate 10 may be within a range of the orthographic projection of the first connection electrode 41 on the first base substrate 10, a fourth insulation film in the first bonding via V1 is removed to expose a surface of the first connection electrode 41, the first bonding via V1 is configured to connect a first bump structure in the connection substrate with the first connection electrode 41 through the bonding via.

In an exemplary implementation, an orthographic projection of another first bonding via V1 on the first base substrate 10 may be within a range of the orthographic projection of the second connection electrode 42 on the first base substrate 10, a fourth insulation film in the first bonding via V1 is removed to expose a surface of the second connection electrode 42, the first bonding via V1 is configured to connect another first bump structure in the connection substrate with the second connection electrode 42 through the via.

At this point, the first substrate disposed on the first carrier plate has been manufactured. In an exemplary implementation, the first substrate may include a first base substrate 10 disposed on the first de-bonding layer 10B, a first insulation layer 11 disposed on the first base substrate 10, a first conductive layer disposed on the first insulation layer 11, a second insulation layer 12 disposed on the first conductive layer, a second conductive layer disposed on the second insulation layer 12, a third insulation layer 13 disposed on the second conductive layer, a third conductive layer disposed on the third insulation layer 13, and a fourth insulation layer disposed on the third conductive layer. The first conductive layer may include, at least, the first pad electrode 31, the second pad electrode 32, and the fourth connection electrode 44, the second conductive layer may include, at least, the first plate 61, and the third conductive layer may include, at least, the first connection electrode 41, the second connection electrode 42, and the second plate 62.

In an exemplary implementation, the first substrate may further include the pad protective layer 90 disposed on a side of the first base substrate 10 away from the first insulation layer 11, and the pad conductive layer disposed on a side of the pad protective layer 90 away from the first base substrate 10, and the pad conductive layer may include, at least, the first pad 21 and the second pad 22.

In an exemplary implementation, the first insulation layer, the second insulation layer, the third insulation layer, and the fourth insulation layer may be made of any one or more of Silicon Oxide (SiOx), Silicon Nitride (SiNx), and Silicon Oxynitride (SiON), and may be a single layer, multi-layers, or a composite layer. The first insulation layer may be referred to as a first barrier layer, the second insulation layer may be referred to as a second (PVX) passivation layer, the third insulation layer may be referred to as a third passivation layer, and the fourth insulation layer may be referred to as a fourth passivation layer.

A Second Part, the Manufacturing of the Second Substrate

In an exemplary implementation, the manufacturing process of the second substrate may include following operations.

Figure 11:
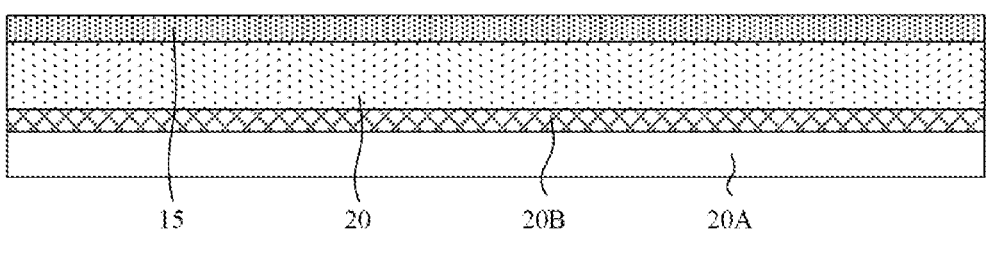
FIG. 11 is a schematic diagram of a filter after forming a pattern of a second base substrate according to an embodiment of the present disclosure.

(21) A pattern of a second base substrate is manufactured. In an exemplary implementation, manufacturing the pattern of the second base substrate may include providing a second carrier plate 20A, forming a second de-bonding layer 20B on the second carrier plate 20A at first, then coating a second base substrate film on the second de-bonding layer 20B, depositing a fifth insulation film after curing the second base substrate film, forming the second base substrate 20, and providing a fifth insulation layer 15 on a side of the second base substrate 20 away from the second carrier plate 20A, as shown in FIG. 11.

In an exemplary implementation, a material of the second base substrate may be polyimide (PI), polyethylene terephthalate (PET) or other materials.

In an exemplary implementation, a material of the second carrier plate may be glass, a material of the second de-bonding layer may be an organic polymer material, and may be formed by coating a viscous liquid and then curing to form a film. The second de-bonding layer is configured to separate the second substrate from the second carrier plate in a subsequent laser lift-off process.

Figure 12:
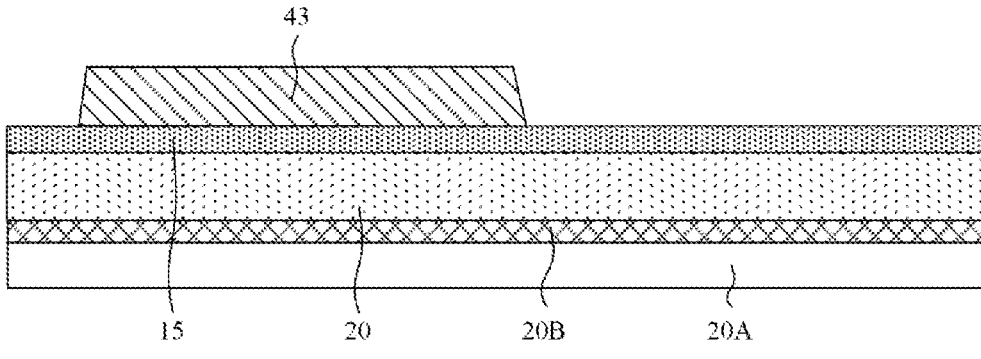
FIG. 12 is a schematic diagram of a filter after forming a pattern of a fourth conductive layer according to an embodiment of the present disclosure.

(22) A pattern of a fourth conductive layer is formed. In an exemplary implementation, forming the pattern of the fourth conductive layer may include depositing a fourth conductive film on the second carrier plate 20A on which the foregoing pattern is formed, and patterning the fourth conductive film by a patterning process to form a pattern of the fourth conductive layer on the fifth insulation layer 15, as shown in FIG. 12.

In an exemplary implementation, the pattern of the fourth conductive layer may include, at least, a third connection electrode 43 configured to connect with a second bump structure in the connection substrate.

In an exemplary implementation, forming the pattern of the fourth conductive layer may also employ a lift-off process.

In an exemplary implementation, after the pattern of the fourth conductive layer is formed, a surface of the side of the third connection electrode 43 away from the second base substrate may be polished by chemical mechanical polishing so that a surface roughness of the surface of the side of the third connection electrode 43 away from the second base substrate may be less than or equal to 1 nm.

Figure 13:
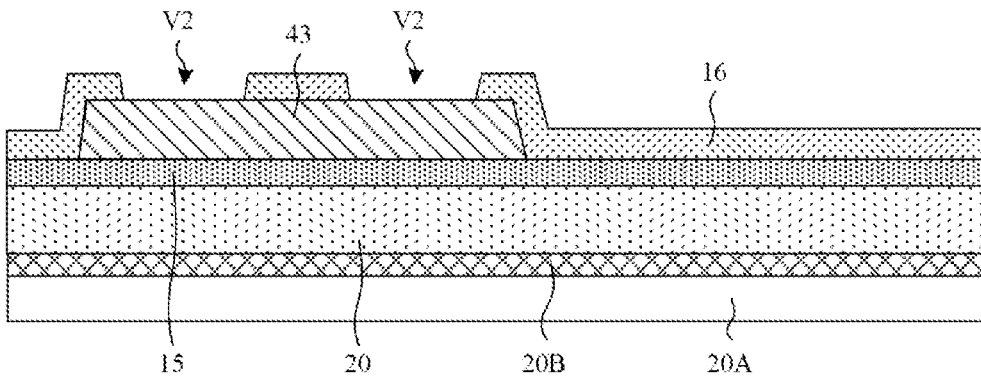
FIG. 13 is a schematic view of a filter after a pattern of a sixth insulation layer is formed according to an embodiment of the present disclosure.

(23) A pattern of a sixth insulation layer is formed. In an exemplary implementation, forming the pattern of the sixth insulation layer may include depositing a sixth insulation film on the second carrier plate 20A on which the foregoing patterns are formed, and patterning the sixth insulation film using a patterning process to form a pattern of a sixth insulation layer 16 covering the pattern of the fourth conductive layer, as shown in FIG. 13.

In an exemplary implementation, two second bonding vias V2 are formed on the sixth insulation layer 16.

In an exemplary implementation, orthographic projections of the two second bonding vias V2 on the second base substrate 20 may be within a range of an orthographic projection of the third connection electrode 43 on the second base substrate 20, a sixth insulation film in the two second bonding vias V2 is removed to expose a surface of the third connection electrode 43, and the two second bonding vias V2 are configured to connect two second bump structures in the connection substrate with the third connection electrode 43 through the bonding vias.

At this point, the second substrate disposed on the second carrier plate has been manufactured. In an exemplary implementation, the second substrate may include the second base substrate 20 disposed on the second de-bonding layer 20B, the fifth insulation layer 15 disposed on the second base substrate 20, the fourth conductive layer disposed on the fifth insulation layer 15, and the sixth insulation layer 16 disposed on the fourth conductive layer, wherein the fourth conductive layer may include, at least, the third connection electrode 43.

A Third Part, the Manufacturing of the Connection Substrate

In an exemplary implementation, the manufacturing process of the connection substrate may include following operations.

Figure 14:
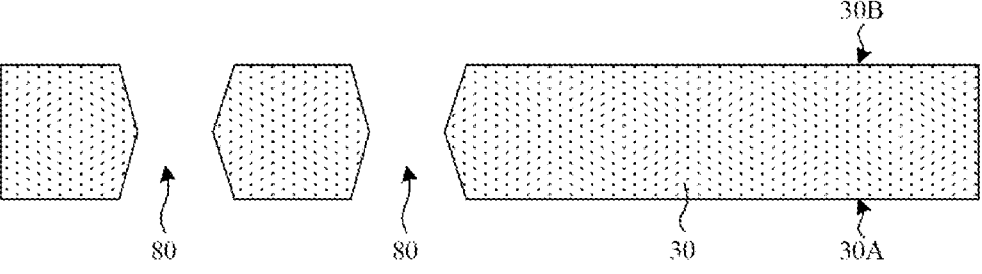
FIG. 14 is a schematic diagram of a filter after manufacturing a pattern of a connection base substrate according to an embodiment of the present disclosure.

(31) A connection base substrate is manufactured. In an exemplary implementation, manufacturing the connection base substrate may include providing a connection base substrate 30, forming at least two through holes 80 on the connection base substrate 30, and forming a connection base substrate 30 of a TGV structure, as shown in FIG. 14.

In an exemplary implementation, structures of the at least two through holes 80 may be substantially the same and both are through hole structures that penetrate the connection base substrate 30. In a plane parallel to the connection base substrate, a shape of the through hole 80 may be circular or elliptical. In a plane perpendicular to the connection substrate, a cross-sectional shape of the through hole 80 may be columnar, funnel-shaped, hourglass-shaped, or the like, and the through hole 80 is configured to accommodate a conductive post formed subsequently.

In an exemplary implementation, the connection base substrate 30 may include a first side surface 30A and a second side surface 30B that are spaced apart from each other. In an exemplary implementation, at least one through hole may be formed using a patterning process or a laser drilling process.

In an exemplary implementation, taking a hourglass-shaped through hole as an example, forming at least one via on the connection base substrate by a patterning process may include coating a layer of photoresist on the first side surface 30A of the connection base substrate at first, exposing and developing the photoresist to form an exposed area and an unexposed area, removing the photoresist in the exposed area to expose the first side surface 30A of the connection base substrate, while the unexposed area is still covered with the photoresist. A connection base substrate in the exposed area is etched by a dry etching process or a wet etching process, and a plurality of first blind vias are formed on the side surface of the connection base substrate, and a cross-sectional shape of the first blind via may be trapezoid. Then, a layer of photoresist is coated on the second side surface 30B of the connection base substrate, and the photoresist is exposed and developed to form an exposed area and an unexposed area. The photoresist in the exposed area is removed to expose the second side surface 30B of the connection base substrate, while the unexposed area is still covered with the photoresist. A connection base substrate in the exposed area is etched by a dry etching process or a wet etching process, and a plurality of second blind vias are formed on the side surface of the connection base substrate, and a cross-sectional shape of the second blind via may be trapezoid, and the second blind via is connected with the first blind via to form an hourglass-shaped through hole.

In an exemplary implementation, taking an hourglass-shaped through hole as an example, forming at least one through hole on the connection base substrate using a laser drilling process may include irradiating, by a laser, a first side surface 30A of the connection base substrate with a laser beam perpendicularly incident at first, forming a first blind via in an inverted frustoconical shape on the side surface of the connection base substrate, then irradiating, by a laser, a second side surface 30B of the connection base substrate with a laser beam perpendicularly incident, and forming a second blind via in an inverted frustoconical shape on the side surface of the connection base substrate, wherein the second blind via is connected with the first blind via to form an hourglass-shaped through hole. When the laser beam interacts with the connection base substrate, atoms in the connection base substrate are ionized by laser photons with higher energy and projected out of the connection base substrate. The holes gradually deepen over time, until the first blind via and the second blind via are formed.

In an exemplary implementation, a type of the laser may be a continuous laser, a pulsed laser and the like, a laser wavelength may be about 532 nm, 355 nm, 266 nm, 248 nm, 197 nm, etc., and a pulse width of the laser may be selected from a range of 1 fs to 100 fs, a range of 1 ps to 100 ps, and a range of 1 ns to 100 ns, etc.

In an exemplary implementation, a method of the laser drilling may include, but is not limited to, the following two methods. In a first method, when a diameter of a laser spot is large, a relative position between the laser beam and the connection base substrate is fixed, and the connection base substrate is deepened directly to a preset depth by high energy. In a second method, when a diameter of a laser spot is small, the laser beam scans circularly on the connection base substrate, a radius of the circle gradually decreases, a focusing point of the spot changes constantly, and a focusing depth changes constantly, so that the connection substrate is deepened to a preset depth.

In an exemplary implementation, a material of the connection base substrate may be glass, e.g. silicon oxide, silicon dioxide, photosensitive glass and the like.

Figure 15:
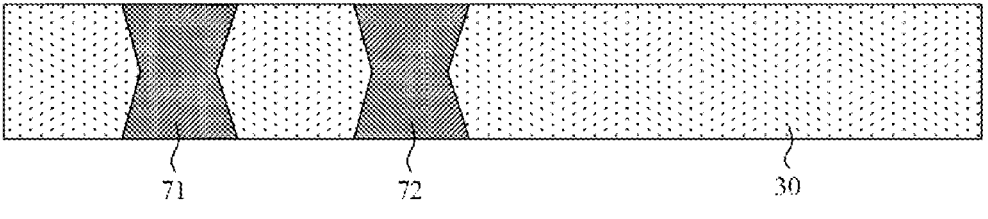
FIG. 15 is a schematic diagram of a filter after manufacturing a pattern of a conductive post according to an embodiment of the present disclosure.

(32) A pattern of a conductive post is manufactured. In an exemplary implementation, manufacturing the pattern of the conductive post may include forming a plurality of patterns of the conductive posts in a plurality of through holes 80 by a filling process, on the connection base substrate on which the foregoing pattern is formed, as shown in FIG. 15.

In an exemplary implementation, the pattern of the conductive post may include, at least, a first conductive post 71 and a second conductive post 72. The first conductive post 71 and the second conductive post 72 may be disposed in the two through holes 80, respectively.

In an exemplary implementation, both of the first conductive post 71 and the second conductive post 72 may include a conductive layer and a seed layer located outside the conductive layer, wherein the seed layer is connected with an inner wall of the through hole 80.

In an exemplary implementation, forming the plurality of patterns of the conductive posts in the plurality of through holes 80 by the filling process may include:

using physical vapor deposition or chemical vapor deposition to form a seed layer on the inner wall of the through hole at first, and then electroplating to form a conductive layer in the seed layer.

In an exemplary implementation, a material of the seed layer may be at least one of copper (Cu), aluminum (Al), molybdenum (Mo), and silver (Ag), and a thickness of the seed layer may be about 0.01 μm to 0.05 μm. For example, the thickness of the seed layer may be about 0.03 μm.

In an exemplary implementation, in order to increase adhesion of the seed layer to the inner wall of the through hole, an auxiliary metal layer may be formed within the through hole before the seed layer is formed, and a material of the auxiliary metal layer includes, but is not limited to, at least one of nickel (Ni), molybdenum (Mo) alloy, titanium (Ti) alloy.

In an exemplary implementation, a material of the conductive layer may be copper (Cu), and a thickness of the conductive layer may be about 0.2 μm to 0.5 μm. In the conductive layer, Cu electroplating, Cu cored solder ball filling or the like can be used to fill the through hole with copper. For example, the connection base substrate is placed on a carrier of an electroplating machine, a powered pad is pressed on the connection base substrate, then the connection base substrate is placed into an electroplating bath with electrolyte, and power-up causes a electroplating solution to flow on a surface of the base substrate continuously and rapidly. Cations in the electroplating solution obtain electrons on an inner wall of the through hole and become atoms deposited on the inner wall. A thickness of copper on the inner wall of the through hole gradually increases over time, even the through hole can be completely filled.

Figure 16:
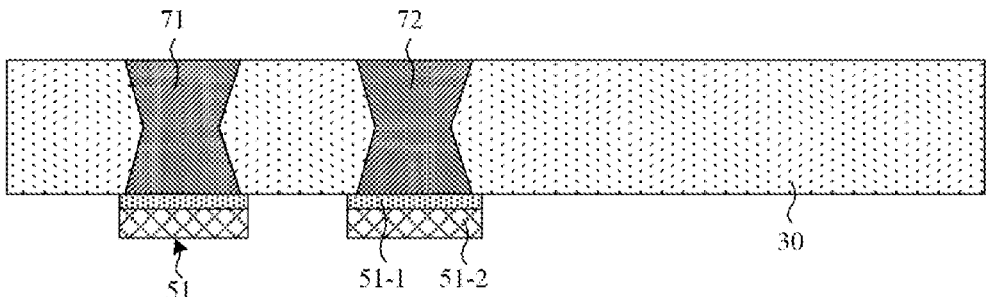
FIG. 16 is a schematic diagram of a filter after forming a pattern of a first bump structure layer according to an embodiment of the present disclosure.

(33) A pattern of a first bump structure layer is formed. In an exemplary implementation, forming the pattern of the first bump structure layer may include forming a pattern of a first bump structure layer on a first side surface of the connection base substrate by a patterning process on the connection base substrate on which the foregoing patterns are formed, as shown in FIG. 16.

In an exemplary implementation, the first bump structure layer may include at least two first bump structures 51, wherein one of the at least two first bump structures 51 is connected with an end of the first conductive post 71 on the first side surface, and another one of the at least two first bump structures 51 is connected with an end of the second conductive post 72 on the first side surface.

In an exemplary implementation, an orthographic projection of the first bump structure 51 on the connection base substrate includes orthographic projections of the first conductive post 71 and the second conductive post 72 on the connection base substrate. That is, the first bump structure 51 completely covers the end of the first conductive post 71 on the first side surface and the end of the second conductive post 72 on the first side surface.

In an exemplary implementation, the first bump structure 51 may include a first connection layer 51-1 and a first bump layer 51-2 which are stacked. The first connection layer 51-1 may be disposed on the connection base substrate 30 and connected with the ends of the first conductive posts 71 and the second conductive posts 72 in the through holes, respectively. The first bump layer 51-2 may be disposed on a side of the first connection layer 51-1 away from the connection base substrate 30, and may serve as a bonding layer for interconnection, so as to bond the first bump layer 51-2, the first conductive post 71 and the second conductive post 72 together, and block atoms in the first bump layer from diffusing to the conductive posts. The first bump layer 51-2 is configured to bond to the first connection electrode and the second connection electrode in the first substrate. In an exemplary implementation, the first connection layer may be referred to as an Under Ball Metal (UBM for short) layer.

In an exemplary implementation, a material of the first connection layer may be of a multilayer composite structure, such as a composite layer Ti/Cu of titanium (Ti) and copper (Cu), a composite layer MTD/Cu of molybdenum-titanium-nickel alloy (MTD) and copper (Cu), a composite layer MTD/CuNi/Cu of molybdenum-titanium-nickel alloy (MTD), copper-nickel alloy (CuNi) and copper (Cu), and the like.

In an exemplary implementation, a material of the first bump layer may be tin (Sn), indium tin alloy (Sn—In) or the like, which has advantages of good extensibility and corrosion resistance.

In an exemplary implementation, forming the pattern of the first bump structure layer on the first side surface of the connection base substrate 30 by the patterning process may include depositing a first connection film on the first side surface of the connection base substrate 30 at first, then coating a layer of photoresist on the first connection film, and forming a photoresist pattern by exposure and development. The photoresist pattern includes an exposed area and an unexposed area, wherein a photoresist in the exposed area is removed to expose the first connection film, while a photoresist in the unexposed area covers the first connection film. After the first bump film is formed in the exposed area by electroplating, the photoresist pattern and a first bump film on the photoresist are lifted off, and the first connection film is etched using a first bump film that is not lifted off as a shield, so as to form two first bump structures 51 on the first side surface of the connection base substrate 30. The first bump structure 51 includes the first connection layer 51-1 and the first bump layer 51-2 that are stacked.

Figure 17:
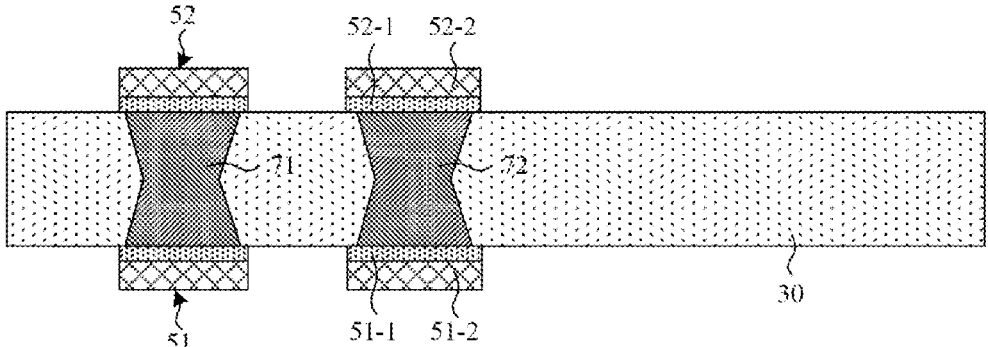
FIG. 17 is a schematic diagram of a filter after forming a pattern of a second bump structure layer according to an embodiment of the present disclosure.

(34) A pattern of a second bump structure layer is formed. In an exemplary implementation, forming the pattern of the second bump structure layer may include forming a pattern of a second bump structure layer on a second side surface of the connection base substrate by a patterning process on the connection base substrate on which the foregoing patterns are formed, as shown in FIG. 17.

In an exemplary implementation, the second bump structure layer may include at least two second bump structures 52, wherein one of the at least two second bump structures 52 is connected with an end of the first conductive post 71 on the second side surface, and another one of the at least two second bump structures 52 is connected with an end of the second conductive post 72 on the second side surface.

In an exemplary implementation, an orthographic projection of the second bump structure 52 on the connection base substrate includes orthographic projections of the first conductive post 71 and the second conductive post 72 on the connection base substrate. That is, the second bump structure 52 completely covers the end of the first conductive post 71 on the second side surface and the end of the second conductive post 72 on the second side surface.

In an exemplary implementation, the second bump structure 52 may include a second connection layer 52-1 and a second bump layer 52-2 that are stacked. The second connection layer 52-1 may be disposed on the connection base substrate 30 and connected with the ends of the first conductive post 71 and the second conductive post 72 in the through holes, respectively. The second bump layer 52-2 may be disposed on a side of the second connection layer 52-1 away from the connection base substrate 30, and the second connection layer 52-1 may serve as a bonding layer for interconnection, and the second connection layer 52-1 may be referred to as a UBM layer.

A material of the second connection layer may be substantially the same as a material of the first connection layer, and a material of the second bump layer may be substantially the same as a material of the first bump layer, so that a manufacturing method for forming the second bump structure layer may be substantially the same as a manufacturing method for forming the first bump structure layer.

At this point, the connection substrate has been manufactured. The connection substrate may include a connection base substrate 30, the first conductive post 71 and the second conductive post 72 penetrating the connection base substrate 30 in the thickness direction, at least two first bump structures 51 disposed on the first side surface of the connection base substrate 30, and at least two second bump structures 52 disposed on the second side surface of the connection base substrate 30.

A Fourth Part, the Bonding Treatment

Figure 18:
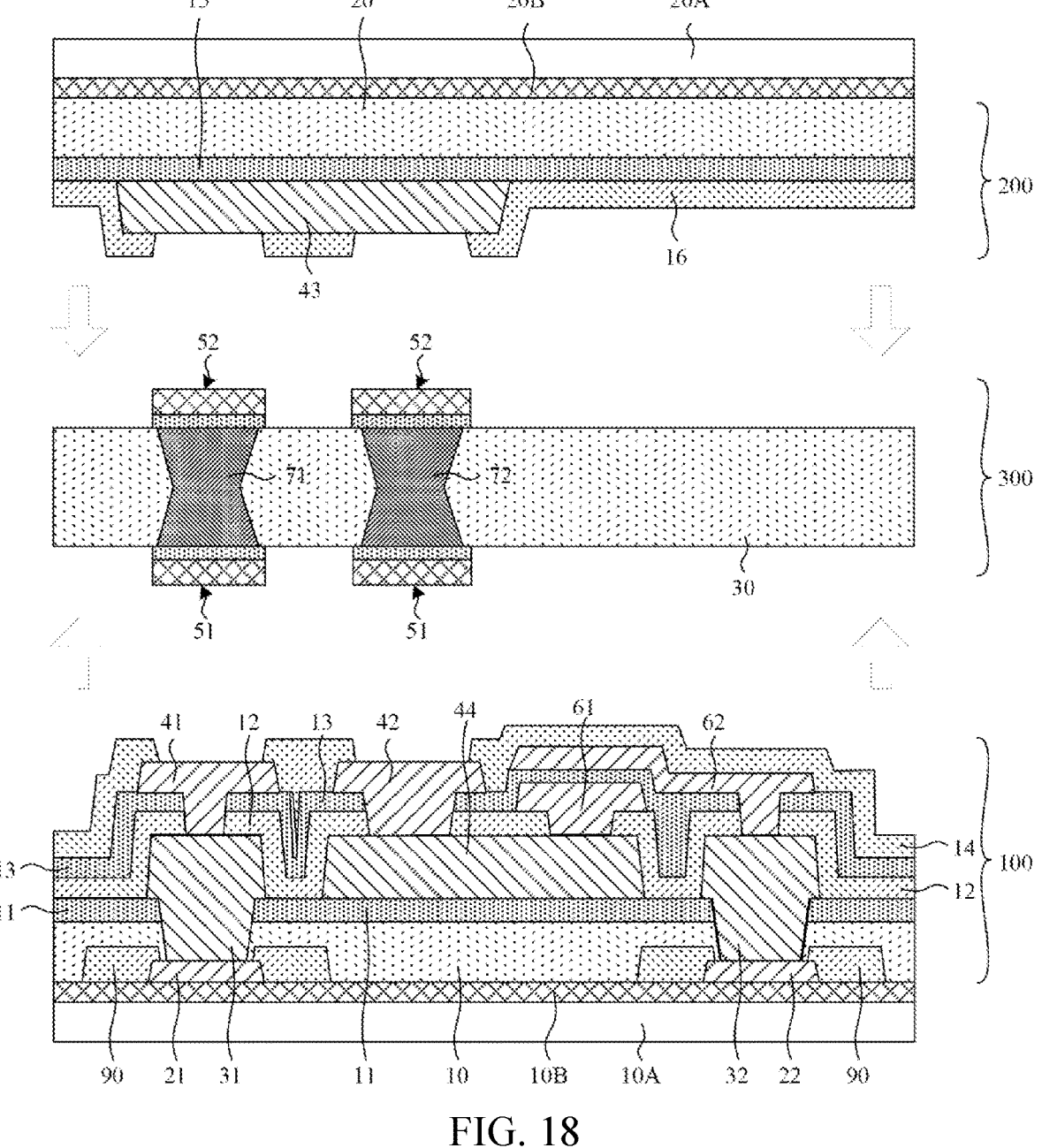
FIGS. 18 and 19 are schematic diagrams of a filter bonding process according to an embodiment of the present disclosure.

In an exemplary implementation, the bonding treatment may include an operation of disposing the manufactured first substrate 100 on a side of the first side surface in the connection substrate 300, and disposing the manufactured second substrate 200 on a side of the second side surface in the connection substrate 300 after the manufactured second substrate 200 is turned over, as shown in FIG. 18.

Figure 19:
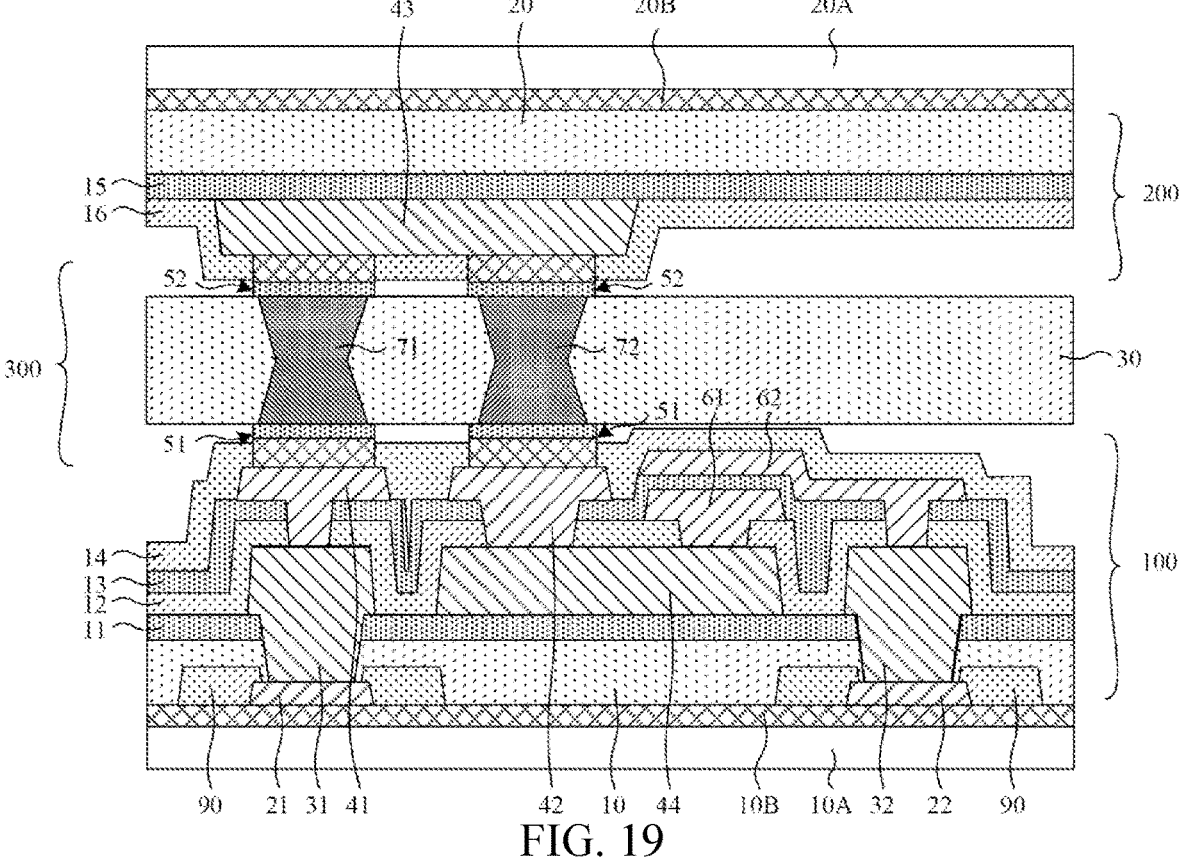

Subsequently, after the first substrate 100, the second substrate 200 and the connection substrate 300 are fitted to each other correspondingly, the first substrate 100, the connection substrate 300 and the second substrate 200 are pressed together by metal-to-metal diffusion bonding. A first bump structure 51 in the connection substrate 300 is bonded to the first connection electrode 41 in the first substrate 100, another first bump structure 51 in the connection substrate 300 is bonded to the second connection electrode 42 in the first substrate 100, and two second bump structures 52 in the connection substrate 300 are bonded to the third connection electrode 43 in the second substrate 200, so as to form an electrical connection structure of the first substrate 100, the connection substrate 300 and the second substrate 200, as shown in FIG. 19.

In an exemplary implementation, during a bonding process, a bonding pressure may be about 40 kN to 100 kN, and a bonding temperature may be about 350° C. to 450° C.

In an exemplary implementation, by the bonding treatment, the first connection electrode 41 in the first substrate 100 and the third connection electrode 43 in the second substrate 200 are interconnected by the first bump structure 51, the first conductive post 71 and the second bump structure 52 in the connection substrate 300, and the second connection electrode 42 in the first substrate 100 and the third connection electrode 43 in the second substrate 200 are interconnected by the first bump structure 51, the second conductive post 72 and the second bump structure 52 in the connection substrate 300. The first connection electrode 41, the first conductive post 71, the third connection electrode 43, the second conductive post 72 and the second connection electrode 42 connected in sequence constitute a filter inductor of a three-dimensional spiral inductor structure.

In an exemplary implementation, since the second connection electrode 42 is connected with the fourth connection electrode 44 through a via, and the first plate 61 is also connected with the fourth connection electrode 44 through a via, interconnection between the filter inductor and the filter capacitor is achieved through the fourth connection electrode 44.

Finally, a first carrier plate 10A and a first de-bonding layer 10B which are on the side of the first substrate 100 away from the connection substrate 300 are lifted off by a laser lift-off process, and the second carrier plate 20A and the second de-bonding layer 20B which are a the side of the second substrate 200 away from the connection substrate 300 are lifted off, so as to form the filter in the exemplary embodiments of the present disclosure, as shown in FIG. 1.

In an exemplary implementation, the first de-bonding layer and the second de-bonding layer are decomposed relatively thoroughly when exposed to light, thereby facilitating separation of the first substrate from the first carrier plate and separation of the second substrate from the second carrier.

At this point, the filter in the exemplary embodiments of the present disclosure has been manufactured.

As can be seen from the structure and the manufacturing process of the filter in the exemplary embodiments of the present disclosure, according to the present disclosure, by manufacturing the first substrate, the second substrate and the connection substrate, respectively, and connecting the first substrate and the second substrate with the two sides of the connection substrate in a bonding manner, not only integration of the filter inductor of the three-dimensional spiral inductor structure with the filter capacitor of the parallel plate capacitor structure on a chip is achieved, but also protrusion of the conductive post of the connection substrate caused by high-temperature annealing, a high-temperature film deposition process, or other methods is avoided, and a problem that the conductive posts in the connection substrate is disconnected from the connection electrodes in the first substrate and the second substrate is eliminated, wherein the integrated filter chip has a high degree of integration, a dimension of the filter is reduced. The present disclosure further improves connection reliability between the conductive posts in the connection substrate and the connection electrodes in the first substrate and the second substrate by disposing the bump structure on the connection substrate and connecting the conductive posts with the connection electrode through the bump structure, thereby maximizing a product yield. The connection substrate of the present disclosure employs a glass base substrate, which can not only reduce filter loss, but also reduce production cost. The manufacturing process according to the present disclosure may be implemented using an existing mature manufacturing equipment, and alterations to the existing process are small, such that the manufacturing process may be well compatible with an existing manufacturing process, be simple to implement, and be easy to practice, thereby achieving high production efficiency, low production cost and high yield rate.

The structure and the manufacturing process of the filter in the exemplary embodiments of the present disclosure are illustrative merely. In an exemplary implementation, corresponding structures may be changed and patterning processes may be added or reduced according to actual needs, which are not limited in the present disclosure. For example, in an exemplary implementation, n through holes penetrating the connection base substrate 30 in the thickness direction may be provided on the connection substrate 300, n conductive posts are provided in the n through holes, respectively, and the n conductive posts may be regularly arranged in a preset direction. The first substrate 100 may be provided with a first connection electrode 41 and n/2 second connection electrodes 42, the second substrate 200 may be provided with n/2 third connection electrodes 43, the first connection electrode 41 may be connected to a first conductive post of the n conductive posts, an (n/2)-th second connection electrode 42 may be connected to an n-th conductive post of the n conductive posts, the other plurality of second connection electrodes 42 may be connected to an (i+1)-th conductive post and an (i+2)-th conductive post of the n conductive posts, respectively, and a plurality of third connection electrodes 43 may be connected to an i-th conductive post and the (i+1)-th conductive post of the n conductive posts, respectively. The n conductive posts, the first connection electrode 41, the n/2 second connection electrodes 42 and the n/2 third connection electrodes 43 constitute a first filter inductor of a three-dimensional spiral inductor structure, wherein n is an even number greater than or equal to 2, and i is an odd number greater than or equal to 1, and less than n−2. The first connection electrode 41 may be connected with a first pad of a resonator, the (n/2)-th second connection electrode 42 may be connected with a first plate of the filter capacitor, and a second plate of the filter capacitor may be connected with a second pad of the resonator.

A method for manufacturing a filter is further provided in an exemplary embodiment of the present disclosure, so as to manufacture the filter in the foregoing embodiments. In an exemplary implementation, the method for manufacturing the filter may include following acts.

A first substrate, a second substrate and a connection substrate are manufactured, respectively, wherein at least one first substrate electrode is provided on the first substrate, at least one second substrate electrode is provided on the second substrate, the connection substrate includes, at least, a connection base substrate and at least one conductive post penetrating through the connection base substrate, an end of the conductive post close to the first substrate is connected with a first bump structure, and an end of the conductive post close to the second substrate is connected with a second bump structure.

The first substrate and the second substrate are disposed opposite to each other, the connection substrate is disposed between the first substrate and the second substrate, the first bump structure is connected with the first substrate electrode in a bonding manner, and the second bump structure is connected with the second substrate electrode in a bonding manner.

In an exemplary implementation, manufacturing the connection substrate may include:

providing a connection base substrate on which a plurality of through holes are formed, wherein a material of the connection base substrate includes glass;

forming a plurality of conductive posts in the plurality of through holes; and forming a plurality of first bump structures on a first side surface of the connection base substrate and forming a plurality of second bump structures on a second side surface of the connection base substrate; wherein the first bump structure includes a first connection layer disposed on a first side surface of the connection base substrate, a first bump layer disposed on a side of the first connection layer away from the connection base substrate, a plurality of first connection layers are connected with ends of the plurality of conductive posts located on the first side surface, correspondingly; the second bump structure includes a second connection layer disposed on a second side surface of the connection base substrate and a second bump layer disposed on a side of the second connection layer away from the connection base substrate, and a plurality of second connection layers are connected with ends of the plurality of conductive posts located on the second side surface, correspondingly.

In an exemplary implementation, forming the plurality of first bump structures on the first side surface of the connection base substrate, and forming the plurality of second bump structures on the second side surface of the connection base substrate may include:

depositing a first connection film on the first side surface of the connection base substrate, coating a layer of photoresist on the first connection film, and forming a photoresist pattern through exposure and development, wherein the photoresist pattern includes an exposed area and an unexposed area, a photoresist in the exposed area is removed to expose the first connection film, while a photoresist in the unexposed area covers the first connection film; lifting off the photoresist pattern and the first bump film on the photoresist pattern after the first bump film is formed in the exposed area, and etching the first connection film by using the first bump film that is not lifted off as a shield, and forming a plurality of first bump structures on the first side surface of the connection base substrate, wherein the first bump structures include a first connection layer and a first bump layer that are stacked;

depositing a second connection film on the second side surface of the connection base substrate, coating a layer of photoresist on the second connection film, and forming a photoresist pattern through exposure and development, wherein the photoresist pattern includes an exposed area and an unexposed area, a photoresist in the exposed area is removed to expose the second connection film, while a photoresist in the unexposed area covers the second connection film; lifting off the photoresist pattern and the second bump film on the photoresist pattern after the second bump film is formed in the exposed area, and etching the second connection film by using the second bump film that is not lifted off as a shield, and forming a plurality of second bump structures on the second side surface of the connection base substrate, wherein the second bump structures include a second connection layer and a second bump layer that are stacked.

The present disclosure also provides an electronic device including the filter in the foregoing embodiments. The electronic device can be used in a radio frequency front-end apparatus in a wireless communication apparatus, such as a radio frequency filter.

Although the implementations of the present disclosure are disclosed above, the described contents are only implementations employed to easily understand the present disclosure but not intended to limit the present disclosure. Those skilled in the art may make any modification and change in the forms and details of the implementations without departing from the essence and scope of the present disclosure. However, the scope of protection of the present disclosure should still be subject to the scope defined by the attached claims.

The invention claimed is:

1. A filter, comprising a first substrate and a second substrate disposed opposite to each other, and a connection substrate disposed between the first substrate and the second substrate, wherein:

at least one first substrate electrode is disposed on the first substrate, at least one second substrate electrode is disposed on the second substrate, the connection substrate comprises, at least, a connection base substrate and at least one conductive post penetrating the connection base substrate in a thickness direction, an end of the conductive post close to the first substrate is provided with a first bump structure, an end of the conductive post close to the second substrate is provided with a second bump structure, the first bump structure is connected with the first substrate electrode in a bonding manner, and the second bump structure is connected with the second substrate electrode in a bonding manner;

the first substrate is further provided with a filter capacitor;

the first substrate comprises, at least, a first base substrate, a first conductive layer disposed on a side of the first base substrate close to the connection substrate, a second conductive layer disposed on a side of the first conductive layer close to the connection substrate, a third conductive layer disposed on a side of the second conductive layer close to the connection substrate; and the filter capacitor comprises a first plate and a second plate, an orthographic projection of the first plate on the first base substrate is overlapped, at least partially, with an orthographic projection of the second plate on the first base substrate, the first plate is disposed in the second conductive layer, and the second plate is disposed in the third conductive layer.

2. The filter of claim 1, wherein the connection base substrate comprises a first side surface close to the first substrate and a second side surface close to the second substrate, the first bump structure is disposed on the first side surface of the connection base substrate and connected with the end of the conductive post close to the first substrate, and the second bump structure is disposed on the second side surface of the connection base substrate and connected with the end of the conductive post close to the second substrate.

3. The filter of claim 1, wherein an orthographic projection of the first bump structure on the connection base substrate comprises an orthographic projection of the conductive post on the connection base substrate, and an orthographic projection of the second bump structure on the connection base substrate comprises an orthographic projection of the conductive post on the connection base substrate.

4. The filter of claim 1, wherein the first bump structure comprises a first connection layer disposed on a first side surface of the connection base substrate, and a first bump layer disposed on a side of the first connection layer away from the connection base substrate, wherein the first connection layer is connected with the end of the conductive post close to the first substrate, the first bump layer is connected with the first substrate electrode in a bonding manner; the second bump structure comprises a second connection layer disposed on a second side surface of the connection base substrate, and a second bump layer disposed on a side of the second connection layer away from the connection base substrate, wherein the second connection layer is connected with the end of the conductive post close to the second substrate, and the second bump layer is connected with the second substrate electrode in a bonding manner.

5. The filter of claim 4, wherein materials of the first connection layer and the second connection layer comprise any of the following: a composite layer of titanium and copper, a composite layer of molybdenum-titanium-nickel alloy and copper, a composite layer of molybdenum-titanium-nickel alloy, copper-nickel alloy and copper.

6. The filter of claim 4, wherein materials of the first bump layer and the second bump layer comprise any of tin, and indium tin alloy.

7. The filter of claim 1, wherein conductive posts comprise, at least, a first conductive post and a second conductive post, first substrate electrodes comprise, at least, a first connection electrode and a second connection electrode, second substrate electrodes comprise, at least, a third connection electrode, the first connection electrode is connected with the first conductive post, the second connection electrode is connected with the second conductive post, the third connection electrode is connected with the first conductive post and the second conductive post, respectively, and the first conductive post, the second conductive post, the first connection electrode, the second connection electrode and the third connection electrode constitute a filter inductor of a three-dimensional spiral inductor structure.

8. The filter of claim 7, wherein the filter capacitor is connected with the filter inductor.

9. The filter of claim 8, wherein the first connection electrode and the second connection electrode are disposed in the third conductive layer.

10. The filter of claim 7, wherein the first conductive layer comprises, at least, a first pad electrode, a second pad electrode and a fourth connection electrode, wherein the first connection electrode is connected with the first pad electrode through a via, the second connection electrode and the first plate are connected with the fourth connection electrode through a via, respectively, and the second plate is connected with the second pad electrode through a via.

11. The filter of claim 10, wherein the first substrate further comprises a pad conductive layer and a pad protective layer, the pad protective layer is disposed on a side of the first base substrate away from the connection substrate, the pad conductive layer is disposed on a side of the pad protective layer away from the connection substrate, the pad conductive layer comprises, at least, a first pad and a second pad, the first pad electrode is connected with the first pad through a via, and the second pad electrode is connected with the second pad through a via.

12. The filter of claim 11, wherein a surface of the side of the pad conductive layer away from the connection substrate is flush with a surface of the side of the first base substrate away from the connection substrate.

13. The filter of claim 11, wherein a surface of the side of the pad protective layer away from the connection substrate is flush with a surface of the side of the first base substrate away from the connection substrate.

14. The filter of claim 7, wherein the conductive posts comprise n conductive posts, the first substrate electrodes comprise one first connection electrode and n/2 second connection electrodes, the second substrate electrodes comprise n/2 third connection electrodes, the first connection electrode is connected with the first conductive post of the n conductive posts, an (n/2)-th second connection electrode is connected with an n-th conductive post of the n conductive posts, other second connection electrodes are connected to an (i+1)-th conductive post and an (i+2)-th conductive post of the n conductive posts, respectively, a plurality of third connection electrodes are connected to an i-th conductive post and the (i+1)-th conductive post of the n conductive posts, respectively, and the n conductive posts, the first connection electrode, the n/2 second connection electrodes and the n/2 third connection electrodes constitute a first filter inductor of a three-dimensional spiral inductor structure, wherein n is an even number greater than or equal to 2, and i is an odd number greater than or equal to 1, and less than n−2.

15. The filter of claim 14, wherein the first substrate is further provided with a first pad and a second pad, wherein the first connection electrode is connected with the first pad, the (n/2)-th second connection electrode is connected with the first plate of the filter capacitor, and the second plate of the filter capacitor is connected with the second pad.

16. The filter of claim 7, wherein the second substrate comprises, at least, a second base substrate, and a fourth conductive layer disposed on a side of the second base substrate close to the connection substrate, and the third connection electrode is disposed in the fourth conductive layer.

17. An electronic device comprising the filter of claim 1.

18. A method for manufacturing a filter, comprising:
manufacturing a first substrate, a second substrate and a connection substrate, respectively, wherein at least one first substrate electrode is provided on the first substrate, at least one second substrate electrode is provided on the second substrate, the connection substrate comprises, at least, a connection base substrate and at least one conductive post penetrating through the connection base substrate, an end of the conductive post close to the first substrate is connected with a first bump structure, and an end of the conductive post close to the second substrate is connected with a second bump structure; and
disposing the first substrate and the second substrate oppositely to each other, disposing the connection substrate between the first substrate and the second substrate, connecting the first bump structure with the first substrate electrode in a bonding manner, and connecting the second bump structure with the second substrate electrode in a bonding manner, wherein the first substrate is further provided with a filter capacitor;

wherein the first substrate comprises, at least, a first base substrate, a first conductive layer disposed on a side of the first base substrate close to the connection substrate, a second conductive layer disposed on a side of the first conductive layer close to the connection substrate, a third conductive layer disposed on a side of the second conductive layer close to the connection substrate; and wherein the filter capacitor comprises a first plate and a second plate, an orthographic projection of the first plate on the first base substrate is overlapped, at least partially, with an orthographic projection of the second plate on the first base substrate, the first plate is disposed in the second conductive layer, and the second plate is disposed in the third conductive layer.

19. The method of claim 18, wherein manufacturing the connection substrate comprises:

providing a connection base substrate on which a plurality of through holes are formed, wherein a material of the connection base substrate comprises glass;

forming a plurality of conductive posts in the plurality of through holes; and forming a plurality of first bump structures on a first side surface of the connection base substrate and forming a plurality of second bump structures on a second side surface of the connection base substrate; wherein the first bump structure comprises a first connection layer disposed on a first side surface of the connection base substrate, a first bump layer disposed on a side of the first connection layer away from the connection base substrate, a plurality of first connection layers are connected with ends of the plurality of conductive posts located on the first side surface, correspondingly; the second bump structure comprises a second connection layer disposed on a second side surface of the connection base substrate and a second bump layer disposed on a side of the second connection layer away from the connection base substrate, and a plurality of second connection layers are connected with ends of the plurality of conductive posts located on the second side surface, correspondingly.

* * * * *